United States Patent
Kaneda et al.

(10) Patent No.: US 9,514,951 B2
(45) Date of Patent: Dec. 6, 2016

(54) SUBSTRATE PROCESSING METHOD, SUBSTRATE PROCESSING APPARATUS, SUBSTRATE PROCESSING SYSTEM AND RECORDING MEDIUM

(71) Applicant: Tokyo Electron Limited, Tokyo (JP)

(72) Inventors: Masatoshi Kaneda, Koshi (JP); Yuzo Ohishi, Koshi (JP); Keisuke Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/744,257

(22) Filed: Jun. 19, 2015

(65) Prior Publication Data

US 2015/0371894 A1 Dec. 24, 2015

(30) Foreign Application Priority Data

Jun. 23, 2014 (JP) .................................. 2014-128430
Apr. 22, 2015 (JP) .................................. 2015-087675

(51) Int. Cl.
| | | |
|---|---|---|
| *H01L 21/311* | (2006.01) | |
| *H01L 21/67* | (2006.01) | |
| *H01L 21/677* | (2006.01) | |
| *H01L 21/687* | (2006.01) | |

(52) U.S. Cl.
CPC ......... *H01L 21/311* (2013.01); *H01L 21/6715* (2013.01); *H01L 21/67109* (2013.01); *H01L 21/67115* (2013.01); *H01L 21/67748* (2013.01); *H01L 21/67751* (2013.01); *H01L 21/68742* (2013.01)

(58) Field of Classification Search
CPC .......................... H01L 21/311; H01L 21/67751
USPC ............................................. 216/66; 438/694
See application file for complete search history.

(56) References Cited

U.S. PATENT DOCUMENTS

2013/0344704 A1* 12/2013 Chhabra ................. C23C 14/00
                                                          438/778

FOREIGN PATENT DOCUMENTS

JP    2003-218116 A    7/2003

* cited by examiner

*Primary Examiner* — Roberts Culbert
(74) *Attorney, Agent, or Firm* — Pearne & Gordon LLP

(57) ABSTRACT

A substrate processing method can remove a part of a processing target film formed on a surface of a substrate W under a normal pressure atmosphere while suppressing an influence upon the substrate. A source material of the processing target film, which is decomposed by irradiating an ultraviolet ray thereto under an oxygen-containing atmosphere, is coated on the substrate W, and the processing target film is formed by heating the source material coated on the substrate W. Then, the substrate W having thereon the processing target film is placed within a processing chamber under the oxygen-containing atmosphere where a gas flow velocity is equal to or smaller than 10 cm/sec, and the part of the processing target film is removed by irradiating the ultraviolet ray to the substrate W.

12 Claims, 20 Drawing Sheets

SUBSTRATE PROCESSING METHOD, SUBSTRATE PROCESSING APPARATUS, SUBSTRATE PROCESSING SYSTEM AND RECORDING MEDIUM

CROSS-REFERENCE TO RELATED APPLICATION

This application claims the benefit of Japanese Patent Application Nos. 2014-128430 and 2015-087675 filed on Jun. 23, 2014 and Apr. 22, 2015, respectively, the entire disclosures of which are incorporated herein by reference.

TECHNICAL FIELD

The embodiments described herein pertain generally to a technique of processing a processing target film by irradiating an ultraviolet ray to a substrate.

BACKGROUND

In a manufacturing process for a semiconductor device having, for example, a multilayer wiring structure, a resist coating process of forming a resist film by coating a resist liquid on a semiconductor wafer (hereinafter, referred to as "wafer"), an exposure process of exposing the resist film to have a preset pattern, a developing process of developing the exposed resist film, and so forth are performed in sequence. Through these processes, a resist pattern is formed on the wafer. Then, an etching process is performed on the wafer by using the resist pattern as a mask. Then, a removing process of removing the resist film or the like is performed, so that the preset pattern is formed on the wafer. By repeating these processes of forming a pattern on each of stacked layers multiple times, a semiconductor device having a multilayer wiring structure is manufactured.

When patterns are formed on the wafer repeatedly, however, a surface to be coated with the resist film needs to be planarized in order to form the resist film of the $(n+1)^{th}$ layer to an appropriate height after a pattern is formed on the $n^{th}$ layer.

Conventionally, to this end, after a processing target film is formed on the pattern of the wafer, a surface of the processing target film is planarized. The processing target film may be formed by using a method involving the processes of: coating a source material on the wafer; forming the processing target film by heating the coated source material; and removing a surface of the processing target film by etching back the processing target film through the use of, for example, a dry etching method (reactive ion etching method), as described in Patent Document 1, for example. Hereinafter, the processing target film coated and formed for the planarization of the substrate will be referred to as a SOC (Spin On Cap) film.

Patent Document 1: Japanese Patent Laid-open Publication No. 2003-218116 (paragraphs [0002] and [0003])

When using the method described in the aforementioned Patent Document 1, the coating and the heating of the source material are performed in a normal pressure atmosphere, whereas the etch-back of the SOC film is performed in a vacuum atmosphere. Thus, the process under the normal pressure atmosphere and the process under the vacuum atmosphere are required to be performed in individual systems, and the wafer needs to be transferred between these different systems. As a result, manufacturing costs for the systems would be increased and a wafer processing throughput would be reduced.

Furthermore, when performing the etch-back of the SOC film through the dry-etching method, the wafer or a film on the wafer may be damaged by plasma. Furthermore, the film on the wafer may be modified by the plasma.

SUMMARY

In view of the foregoing problems, exemplary embodiments provide a substrate processing method, a substrate processing apparatus, a substrate processing system and a recording medium having recorded thereon the substrate processing method capable of removing a part of a processing target film formed on a surface of a substrate under a normal pressure atmosphere while suppressing an influence upon the substrate.

In one exemplary embodiment, a substrate processing method includes coating a source material of a processing target film, which is decomposed by irradiating an ultraviolet ray thereto under an oxygen-containing atmosphere, on a substrate; forming the processing target film by heating the source material coated on the substrate; and removing a part of the processing target film by placing the substrate having thereon the processing target film within a processing chamber under the oxygen-containing atmosphere where a gas flow velocity is equal to or smaller than 10 cm/sec, and, then, by irradiating the ultraviolet ray to the substrate.

In another exemplary embodiment, a substrate processing method includes coating a source material of a processing target film, which is decomposed by irradiating an ultraviolet ray thereto under an oxygen-containing atmosphere, on a substrate; forming the processing target film by heating the source material coated on the substrate; removing a part of the processing target film by placing the substrate having thereon the processing target film within a processing chamber provided with a gas exhaust device under the oxygen-containing atmosphere, and, then, by irradiating the ultraviolet ray to the substrate in a state where an exhaust of an inside of the processing chamber by the gas exhaust device is stopped; and exhausting the inside of the processing chamber by the gas exhaust device.

Each of the substrate processing methods includes configurations to be described below:

The substrate processing method may include generating the oxygen-containing atmosphere by supplying an oxygen-containing gas, having an oxygen concentration higher than that in the air and equal to or lower than 60 vol %, into the processing chamber before the removing of the part of the processing target film. Here, in the substrate processing method of the another exemplary embodiment, the generating of the oxygen-containing atmosphere, the removing of the part of the processing target film and the exhausting of the inside of the processing chamber may be repeatedly performed.

The substrate processing method may include supplying an exhausting gas for facilitating the exhaust of the inside of the processing chamber when performing the exhausting of the inside of the processing chamber by the gas exhaust device. The supplying of the exhausting gas may be performed when performing the exhausting of the inside of the processing chamber.

The substrate processing method may include heating the substrate while performing the removing of the part of the processing target film. The heating of the substrate may be performed such that a temperature of a peripheral portion of the substrate becomes lower than a temperature of a central portion of the substrate.

The removing of the part of the processing target film may be performed under a condition where an illuminance of the ultraviolet ray is respectively set for regions of the substrate.

The substrate processing method may include placing the substrate coated with at least the source material of the processing target film on a placing table at a transfer position, and then, moving the placing table up to a processing position; and lowering the placing table, on which the substrate from which the part of the processing target film is removed is placed, from the processing position to the transfer position, and then, carrying out the substrate. Here, an opening may be formed at a bottom surface of the processing chamber, and the placing table may be configured to be fitted into the opening and hold the substrate placed thereon, and an elevating device may be configured to move the placing table up and down between the transfer position where the substrate is transferred and the processing position which is above the transfer position and where the opening of the processing chamber is blocked and the substrate is placed within the processing chamber.

The processing target film may be an organic film containing a carbon compound.

The coating of the source material of the processing target film may be performed on the substrate having thereon a pattern. The coating of the source material of the processing target film on the substrate, the forming of the processing target film and the removing of the part of the processing target film may be performed multiple times in this sequence. Further, in the removing of the part of the processing target film performed at least before the last time, the part of the processing target film may be removed until a surface of the pattern is exposed.

In yet another exemplary embodiment, a substrate processing apparatus includes a placing table configured to hold thereon a substrate having a processing target film, which is decomposed by irradiating an ultraviolet ray thereto under an oxygen-containing atmosphere; a processing chamber, configured to accommodate therein the substrate placed on the placing table, having therein the oxygen-containing atmosphere; and an ultraviolet ray irradiation device configured to irradiate the ultraviolet ray to the substrate within the processing chamber. The placing table is provided with a surrounding member configured to surround the substrate placed on the placing table and restrict a gas introduction amount from an outside of the substrate toward above the substrate.

In still another exemplary embodiment, a substrate processing apparatus a placing table configured to hold thereon a substrate having a processing target film, which is decomposed by irradiating an ultraviolet ray thereto under an oxygen-containing atmosphere; a processing chamber, configured to accommodate therein the substrate placed on the placing table, having therein the oxygen-containing atmosphere; an ultraviolet ray irradiation device configured to irradiate the ultraviolet ray to the substrate within the processing chamber; a gas exhaust device configured to exhaust an inside of the processing chamber; and a controller configured to output a control signal such that a removing process of removing a part of the processing target film by irradiating the ultraviolet ray to the substrate from the ultraviolet ray irradiation device is performed in a state where the exhaust of the inside of the processing chamber by the gas exhaust device is stopped and then an exhausting process of exhausting the inside of the processing chamber by the gas exhaust device is performed.

According to the exemplary embodiments, since a part of the processing target film is removed by irradiating the ultraviolet ray thereto, it is possible to perform the processing under a normal pressure atmosphere while suppressing an influence upon the substrate. At this time, by irradiating the ultraviolet ray within the processing chamber in which a gas flow velocity is equal to or less than 10 cm/sec, an influence from a gas flow can be suppressed, and, thus, the partial removal of the processing target film can be carried out uniformly over a surface of the substrate.

According to the other exemplary embodiments, when irradiating the ultraviolet ray to the substrate within the processing chamber equipped with the gas exhaust device, by stopping the exhaust of the inside of the processing chamber through the gas exhaust device, the influence from the gas flow can be suppressed. Hence, the partial removal of the processing target film can be performed uniformly over the surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
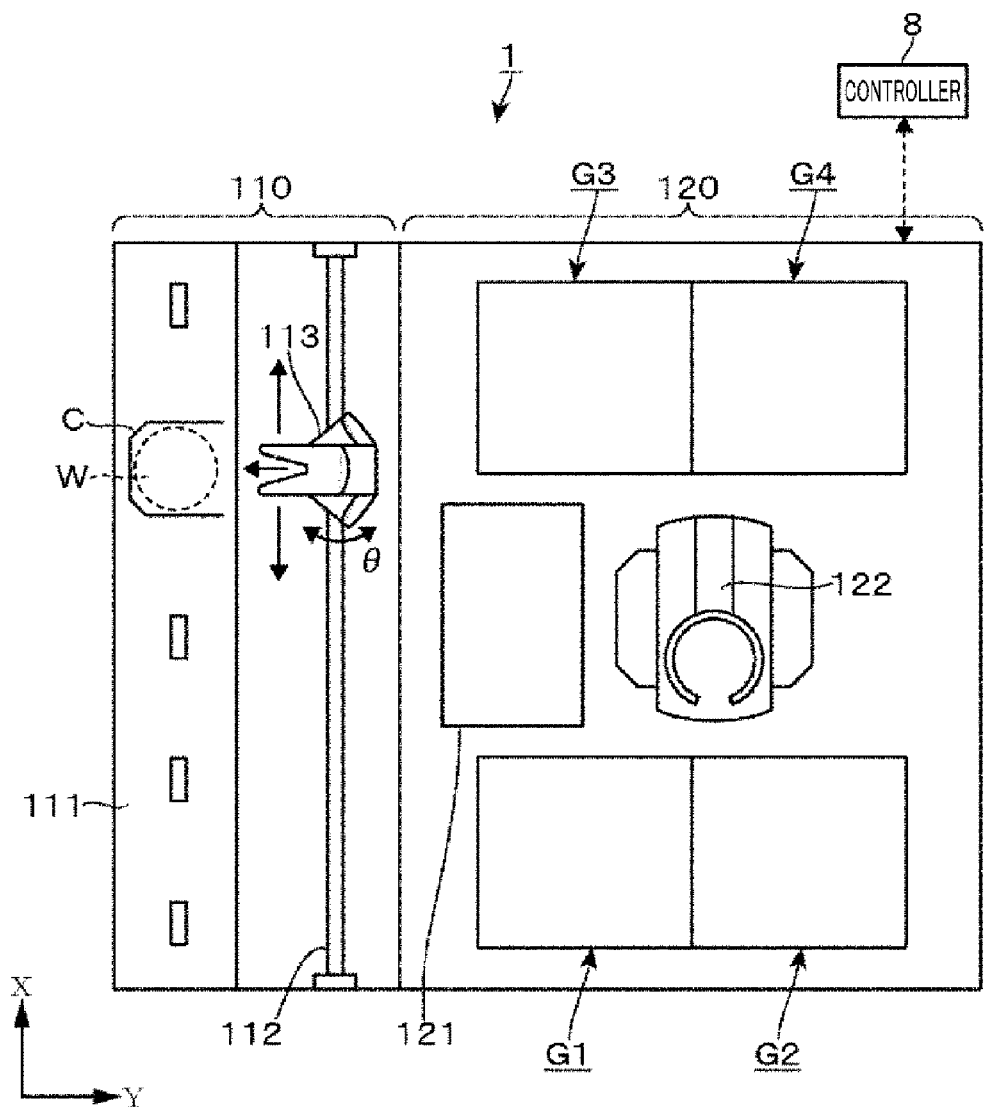
FIG. 1 is a plan view of a wafer processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
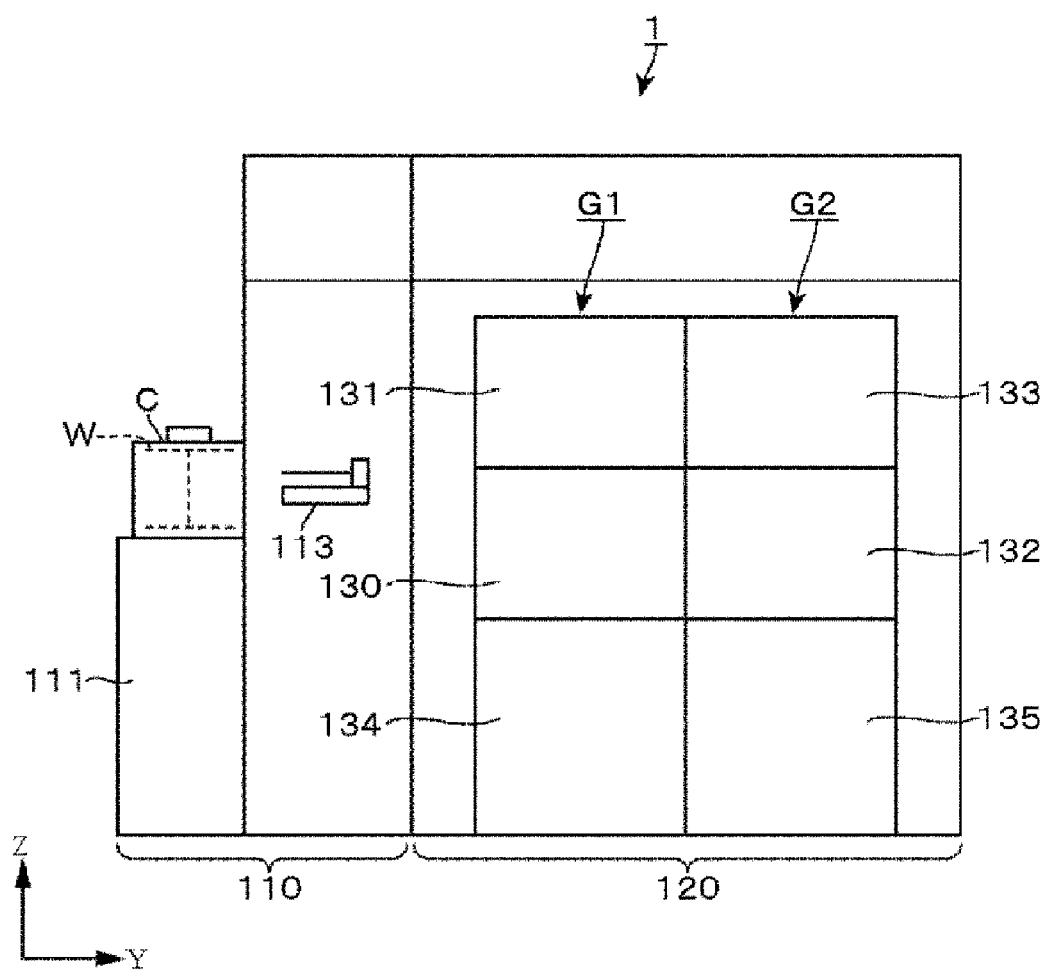
FIG. 2 is a longitudinal side view of the wafer processing system.
Figure 3:
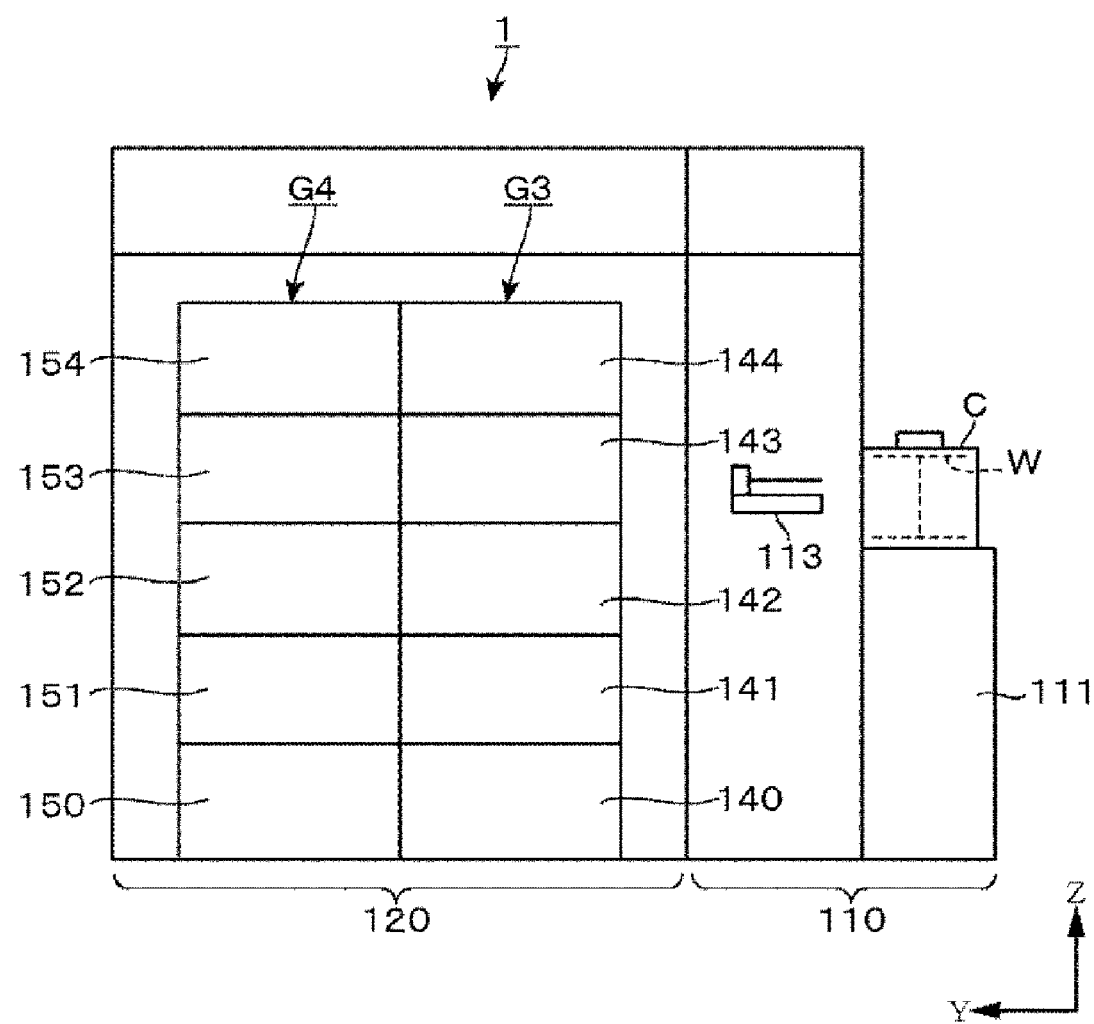
FIG. 3 is a longitudinal side view of the wafer processing system, seen from a different direction.

Hereinafter, exemplary embodiments will be described. FIG. 1 is a plan view illustrating an outline of a wafer processing system (substrate processing system) 1 according to a first exemplary embodiment. FIG. 2 and FIG. 3 are side views illustrating an outline of the inside of the wafer processing system 1. The present exemplary embodiment will be described for a case where the wafer processing system 1 forms an organic film, which is decomposed by irradiating an ultraviolet ray thereto, as a SOC film on a surface of a wafer W serving as a substrate. Further, a pattern of a $SiO_2$ film or the like is previously formed on the surface of the wafer W to be processed in the wafer processing system 1.

As depicted in FIG. 1, the wafer processing system 1 includes a cassette station 110; and a processing station 120 connected thereto. In the cassette station 110, carry-in/out of a cassette C accommodating a multiple number of, e.g., 25 sheets of wafers W is carried-in/out the outside thereof and, also, the wafer W is carried-in/out the cassette C. The processing station 120 includes a multiple number of processing apparatuses, each of which is configured to perform a preset process on the wafer W.

Below, in the description of the wafer processing system 1, a direction where the cassette station 110 is located will be defined as a front side, and a direction where the processing station 120 is located will be referred to as a rear side.

The cassette station 110 is equipped with a cassette placing table 111. The cassette placing table 111 is arranged in a single row along a front-side surface of the wafer processing system 1. A multiple number of cassettes C can be placed on the cassette placing table 111.

Provided within the cassette station 110 is a wafer transfer device 113 configured to be movable is carried-in/out on a travel path 112 which is extended in a left-right direction when viewed from the front side. The wafer transfer device 113 is configured to be also movable vertically and pivotable around the vertical axis (i.e., movable in a θ direction) and is capable of transferring the wafer W between the cassette C and the processing station 120.

The processing station 120 has a wafer transfer device 122 provided at a central portion thereof. For example, four processing blocks G1 to G4, each of which includes various kinds of processing apparatuses arranged in multiple levels, are provided around the wafer transfer device 122. On the right side of the wafer transfer device 122 when viewed from the front side, a first processing block G1 and a second processing block G2 are arranged in this sequence from the front side. On the left side of the wafer transfer device 122 when viewed from the same direction, a third processing block G3 and a fourth processing block G4 are arranged in this sequence from the front side.

Further, a delivery table 121 for delivering the wafer W is provided at a front central position of the processing station 120 facing the cassette station 110. The wafer transfer device 122 is capable of transferring the wafers W into/from the delivery table 121 and the various processing apparatuses to be described later, which are disposed in the processing blocks G1 to G4.

As depicted in FIG. 2, in the first processing block G1, coating apparatuses 130 and 131, each of which is configured to coat a source material for forming a SOC film on a wafer W, are stacked in two levels in sequence from below. Likewise, in the second processing block G2, coating apparatuses 132 and 133 are stacked in two levels in sequence from below. At the lowermost levels of the first processing block G1 and the second processing block G2, chemical chambers 134 and 135 for supplying the source material of the SOC film to the coating apparatuses 130 to 133 are provided, respectively.

Here, a liquid, which is prepared by dissolving an organic film source material, for example, a polymer source material having a polyethylene structure $((-CH_2-)_n)$, containing a carbon compound to be decomposed through a reaction with active oxygen or ozone generated as a result of irradiating an ultraviolet ray in an oxygen-containing atmosphere, into a solvent may be used as the source material of the SOC film supplied from the chemical chambers 134 and 135.

As depicted in FIG. 3, in the third processing block G3, wafer processing apparatuses 140, 141 and 142 each configured to perform heat treatment or ultraviolet ray irradiation on the wafer W and temperature control apparatuses 143 and 144 each configured to adjust a temperature of the wafer W are stacked in five levels in sequence from the bottom. As in the third processing block G3, wafer processing apparatuses 150, 151 and 152 and temperature control apparatuses 153 and 154 are stacked in five levels in sequence from the bottom in the fourth processing block G4.

Figure 4:
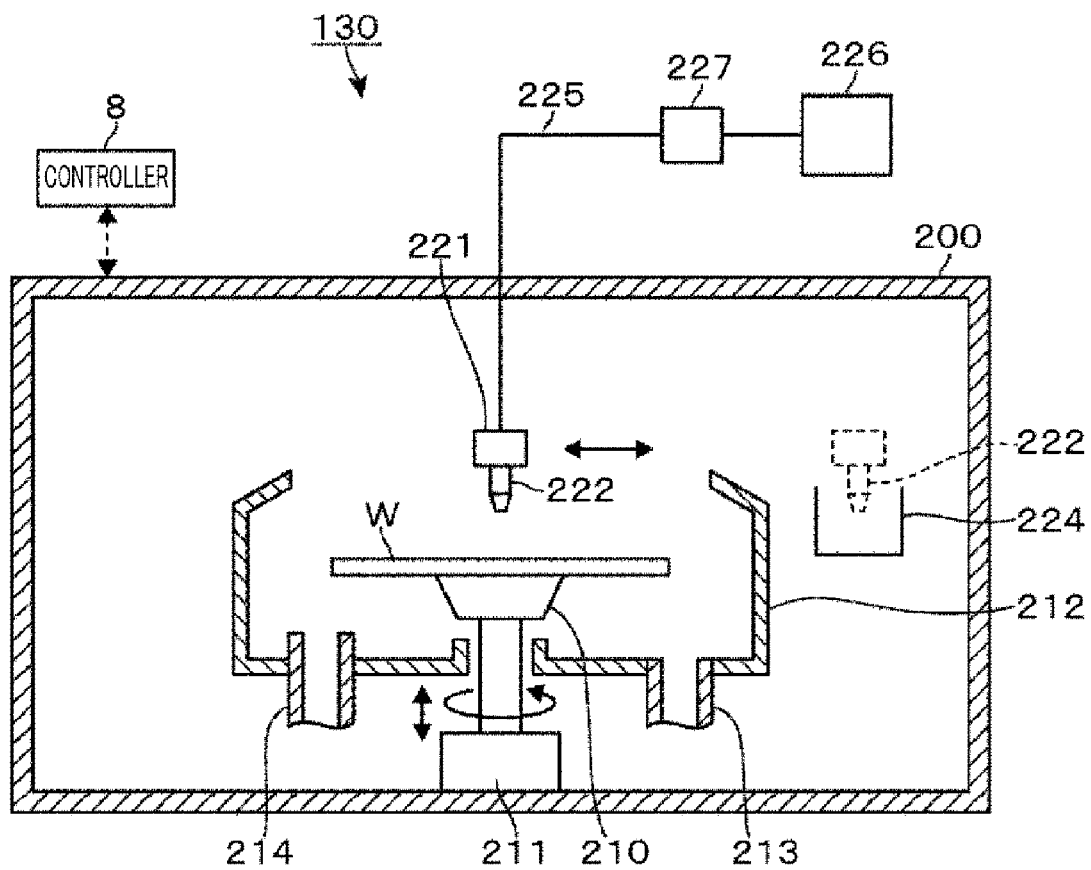
FIG. 4 is a longitudinal side view of a coating apparatus provided in the wafer processing system.

Now, configurations of the coating apparatuses 130 to 133 will be explained. Since the coating apparatuses 130 to 133 have the same configuration, only the configuration of the coating apparatus 130 is illustrated in FIG. 4 as an example.

The coating apparatus 130 has a processing vessel 200, the inside of which is hermetically sealable. A carry-in/out opening (not shown) for the wafer W is each in a side surface of the processing vessel 200 at the side of the wafer transfer device 122. A shutter (not shown) is provided at the carry-in/out opening.

A spin chuck 210 configured to hold and rotate the wafer W thereon is provided within the processing vessel 200. A placing surface for the wafer W is formed on a top surface of the spin chuck 210, and a suction hole (not shown) for suctioning the wafer W is formed on the placing surface. The wafer W can be attracted to and held on the spin chuck 210 by being suctioned through this suction hole.

A chuck driving device 211 having, for example, a motor is provided under the spin chuck 210. The spin chuck 210 is configured to be rotated at a preset speed by the chuck driving device 211. Further, the chuck driving device 211 is also equipped with an elevating device such as a cylinder configured to be moved up and down.

A recovery cup 212 for receiving and collecting a liquid dispersed or falling from the wafer W is provided around the spin chuck 210. Connected to a bottom surface of the recovery cup 212 are a discharge line 213 through which the collected liquid is discharged and an exhaust line 214 through which an atmosphere within the recovery cup 212 is exhausted.

A coating nozzle 222 held by a nozzle head 221 is provided above the spin chuck 210. The nozzle head 221 is held by an arm (not shown) which is configured to be moved along a rail (not shown) extended in the left-right direction in FIG. 4. Provided at the side of the recovery cup 212 is a nozzle bus 224 in which the nozzle 222 stands for a time period during which the source material onto the wafer W is not coated.

Accordingly, the coating nozzle 222 can be moved between the nozzle bus 224 as a standby position and a position above a central portion of the wafer W at which the source material is supplied onto the wafer W placed on the spin chuck 210. Further, the arm holding the nozzle head 221 is configured to be moved up and down, so that height of the coating nozzle 222 can be adjusted.

A supply line 225 through which the source material of the SOC film is supplied to the coating nozzle 222 is connected to the coating nozzle 222. The supply line 225 communicates with a source material supply source 226 that stores the source material therein. Further, the supply line 225 is provided with a flow rate controller 227 that stops the supply of the source material or adjusts a flow rate of the source material.

A back rinse nozzle (not shown) configured to discharge a cleaning liquid toward a rear surface of the wafer W may be provided under the spin chuck 210. The rear surface of the wafer W and a peripheral portion of the wafer W may be cleaned by the cleaning liquid discharged from the back rinse nozzle.

Now, referring to FIG. 5 to FIG. 8, configurations of the aforementioned wafer processing apparatuses 140 to 142 and 150 to 152 will be discussed. Since these wafer processing apparatuses 140 to 142 and 150 to 152 have the same configuration, only the configuration of the wafer processing apparatus 140 is illustrated in FIG. 5 to FIG. 8 as an example.

Figure 5:
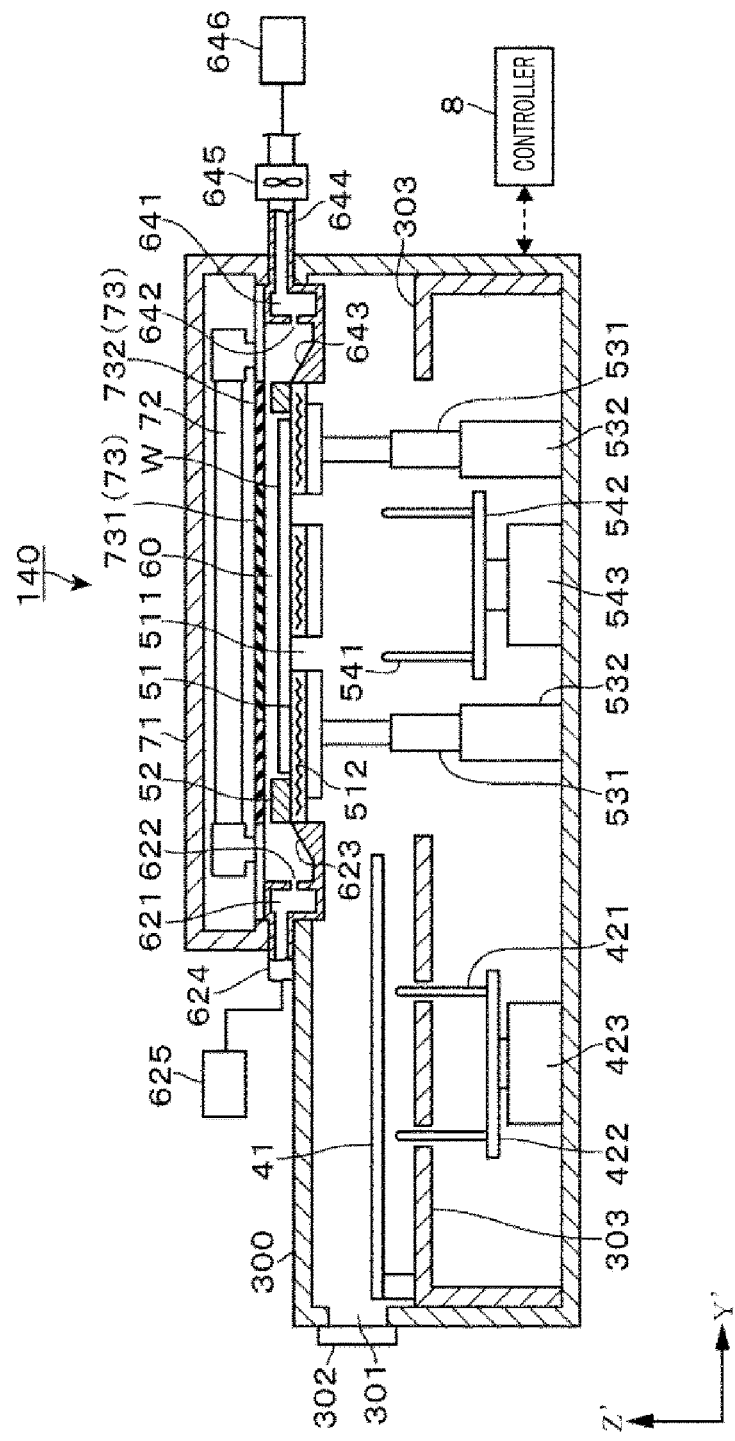
FIG. 5 is a longitudinal side view of a wafer processing apparatus provided in the wafer processing system.

As shown in FIG. 5, the wafer processing apparatus 140 is provided with a flat housing 300 having a long and narrow rectangular shape elongated in the front/rear direction. A carry-in/out opening 301 for the wafer W and a shutter 302 for opening or closing the carry-in/out opening 301 are provided at a side wall surface of the housing 300 at the front side thereof.

The inside of the housing 300 is partitioned into an upper space and a lower space by a partition plate 303. A transfer arm 41 configured to transfer the wafer W is provided in the upper space above the partition plate 303 at the front side when viewed from the carry-in/out opening 301. The transfer arm 41 is equipped with a non-illustrated moving device that enables the transfer arm 41 to be moved between a front position where the wafer W is transferred between the transfer arm 41 and the wafer transfer device 122 of the wafer processing system 1 and a rear position where the wafer W is delivered between the transfer arm 41 and a placing table 51 to be described later. The transfer arm 41 also serves as a cooling arm that cools the processed wafer W.

Supporting pins 421 configured to support the wafer W temporarily when the wafer W is delivered between the wafer transfer device 122 and the transfer arm 41 are provided at the front position where the wafer W is delivered to/from the wafer transfer device 122. The supporting pins 421 are connected to an elevation motor 423 via an elevating member 422 which is provided in the lower space under the partition plate 303. With this configuration, the supporting pins 421 can be moved up and down between a position below a wafer placing surface of the transfer arm 41 and a position which is above this wafer placing surface and at which the wafer W is delivered to/from the wafer transfer device 122.

The placing table 51 for the wafer W is provided at a position at the rear side of the position where the wafer W is delivered between the transfer arm 41 and the wafer transfer device 122. As depicted in a plan view of FIG. 6, the placing table 51 is formed of a rectangular plate member which is made of a ceramic material such as SiC or AlN. The placing table 51 has a heater 512 embedded therein to serve as a heating device configured to heat the wafer W. The heater 512 is divided in a diametrical direction of the wafer W and is configured to vary a heating temperature for individual areas of the wafer W. Detailed configuration of this heater will be elaborated later.

Figure 8:
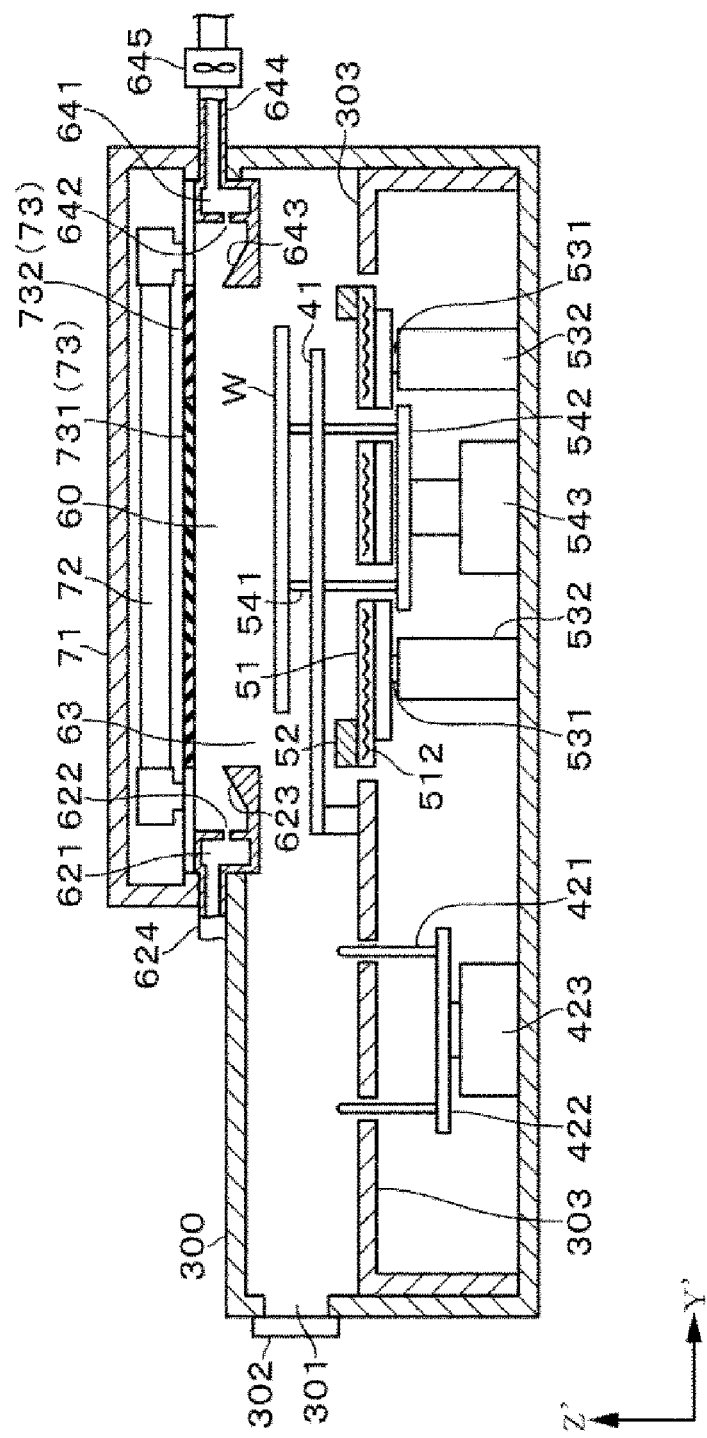
FIG. 8 is a longitudinal side view showing a state where a placing table is lowered from the processing chamber.

The placing table 51 is supported by a multiple number of extensible/contractible supporting members 531 from the rear surface thereof. By extending and contracting the supporting members 531 by motors 532 provided at base end portions of the respective supporting members 531, the placing table 51 can be moved up and down in the vertical direction between a processing position where the wafer W is processed and a delivery position where the wafer W is delivered to/from the transfer arm 41. The partition plate 303 is provided with a notch corresponding to the shape of the placing table 51. As depicted in FIG. 8, when the placing table 51 is lowered, the placing table 51 is fitted into the notch, and the partition plate 303 and the placing table 51 are substantially arranged on the same plane.

Figure 6:
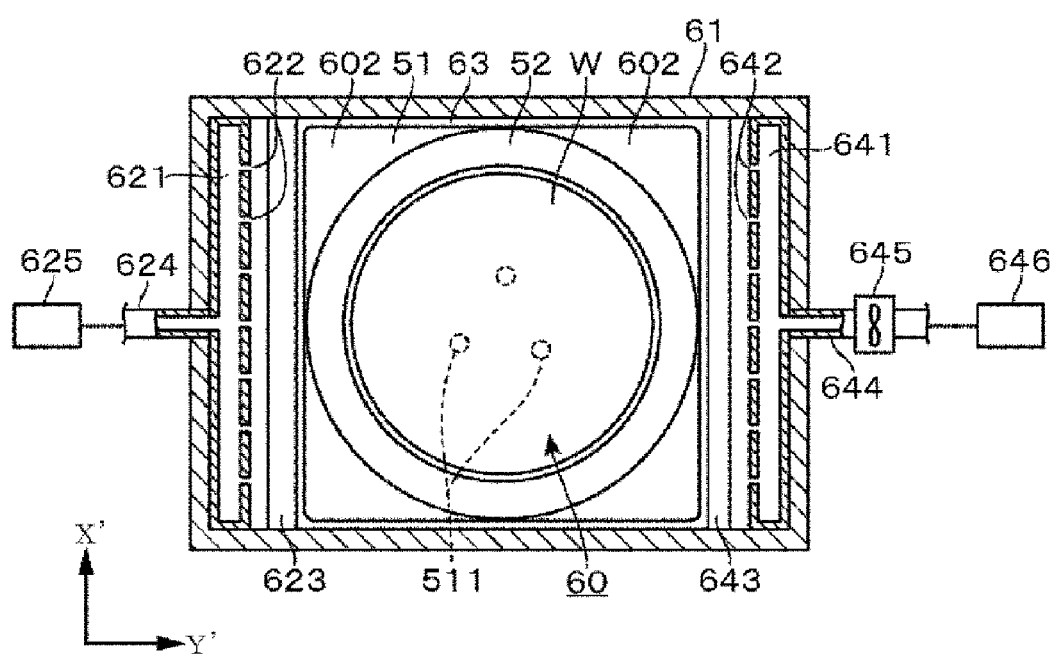
FIG. 6 is a horizontal plan view of a processing chamber provided in the wafer processing apparatus.

As illustrated in FIG. 5 and FIG. 8, under the placing table 51 are provided supporting pins 541 configured to support the wafer W temporarily when the wafer W is delivered between the placing table 51 and the transfer arm 41. As shown in FIG. 6, the placing table 51 is provided with through holes 511 through which the supporting pins 541 are allowed to pass. When the placing table 51 is lowered downwards, tip end portions of the supporting pins 541 are protruded from a top surface of the placing table 51.

The supporting pins 541 are connected to an elevation motor 543 via an elevating member 542. The supporting pins 541 are moved up and down between a position under the wafer placing surface of the transfer arm 41 which is moved to a position above the placing table 51 and a position above this wafer placing surface, so that the wafer W can be delivered to/from the transfer arm 41. Further, by moving the placing table 51 up and down after the transfer arm 41 is retreated to the front position, the wafer W is delivered between the placing table 51 and the supporting pins 541.

An opening 63 having a shape corresponding to the placing table 51 is formed in a ceiling surface of the housing 300 above the placing table 51. Further, a flat processing chamber 61 is provided on a top surface of the housing 300 to cover the opening 63. The placing table 51 supported by the supporting members 531 can be fitted into the opening 63, so that a processing space 60 for the wafer W can be formed between the placing table 51 and the processing chamber 61 (FIG. 5).

A height dimension between a top surface of the wafer W placed on the placing table 51 and a ceiling surface (a UV transmission member 73 to be described later) of the processing space 60 is in a range from several millimeters (mm) to several tens of millimeters (mm), for example, 3 mm.

In this processing space 60, a process of forming a SOC film by heating the wafer W coated with the source material of the SOC film and a process of removing a part of the SOC film by irradiating an ultraviolet ray (UV light) to this SOC film are performed.

As illustrated in FIG. 5 and FIG. 6, a gas introduction room 621 extended in the left-right direction when viewed from the front side is formed along a front-side periphery of the placing table 51 at a position in front of the processing space 60. The gas introduction room 621 is connected to a clean air supply device 625 via an air supply line 624. Clean air is supplied from the clean air supply device 625 to the gas introduction room 621.

Further, a multiple number of gas introduction holes 622 are formed with a gap therebetween in a sidewall surface of the gas introduction room 621 that faces the processing space 60. Accordingly, the clean air supplied into the gas introduction room 621 is uniformly introduced into the processing space 60. Further, a tapered portion 623 provided between the gas introduction room 621 and the processing chamber 61 is configured to adjust a discharge position of the clean air from the gas introduction holes 622 and an introduction position of the clean air into the processing space 60.

Meanwhile, a gas exhaust room 641 extended in the left-right direction when viewed from the front side is formed along a rear-side periphery of the placing table 51 at a position behind the processing space 60. The gas exhaust room 641 is connected to a gas exhaust line 644 which is equipped with a gas exhaust fan 645 configured to exhaust an atmosphere within the processing space 60. The gas exhaust line 644 is connected to an external harm-removing facility 646.

The gas exhaust room 641, the gas exhaust line 644, the gas exhaust fan 645, and so forth correspond to a gas exhaust device according to the present exemplary embodiment.

A multiple number of gas exhaust holes 642 are formed with a gap therebetween in a sidewall surface of the gas exhaust room 641 that faces the processing space 60. The atmosphere within the processing space 60 is exhausted through these gas exhaust holes 642. A tapered portion 643 provided between the processing chamber 61 and the gas exhaust room 641 is configured to adjust a discharge position of the atmosphere within the processing space 60 and an exhaust position from the gas exhaust holes 642.

As depicted in FIG. 5 and FIG. 6, as the gas introduction room 621 and the gas exhaust room 641 are arranged to be opposed to each other at the front and rear sides with the processing space 60 therebetween, a one-direction flow of the clean air, which flows toward the gas exhaust room 641 through the processing space 60 after supplied from the gas introduction room 621, is formed within the processing space 60.

Figure 7:
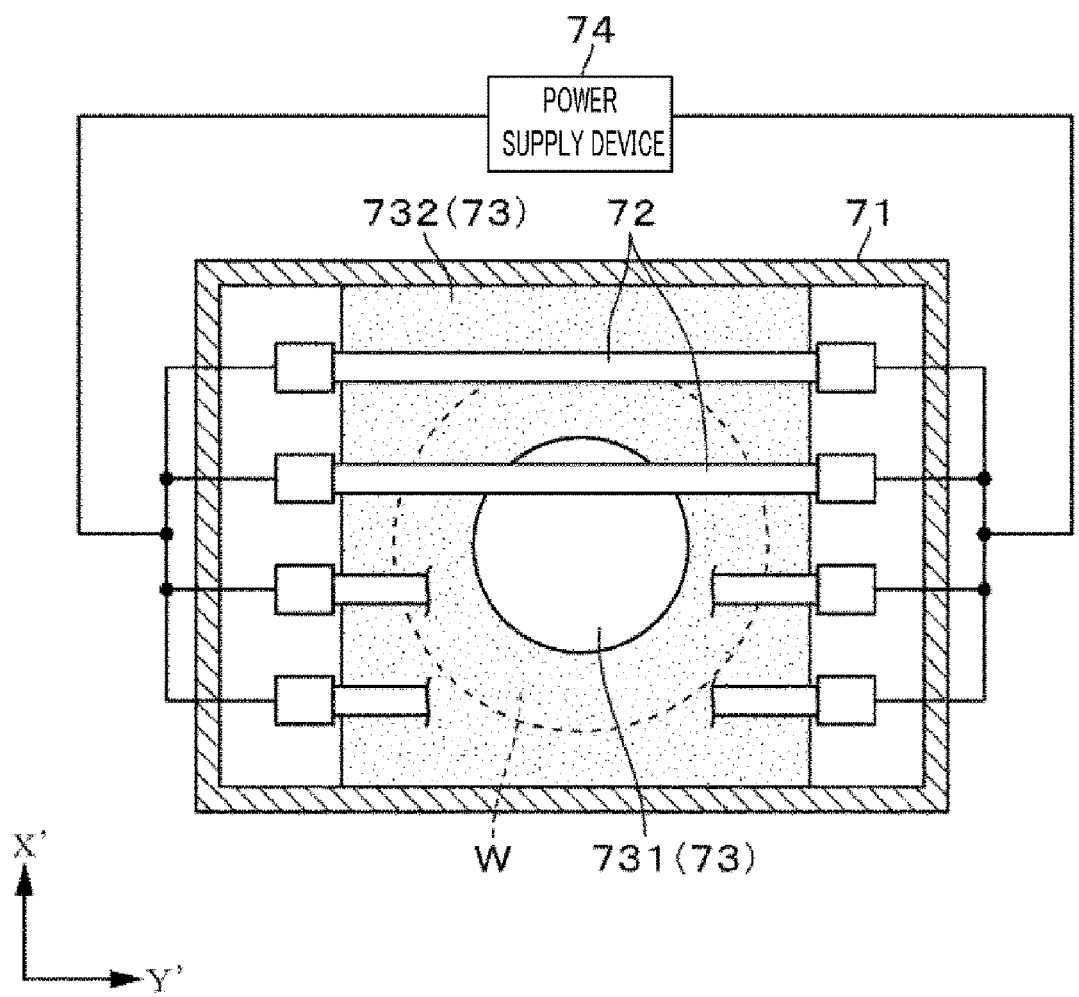
FIG. 7 is a horizontal plan view of a lamp chamber provided in the wafer processing apparatus.

A lamp chamber 71 which accommodates therein UV lamps 72 for irradiating UV rays to the wafer W placed in the processing space 60 is provided at an upper side of the processing chamber 61. As shown in FIG. 7, each of the multiple straight tube-shaped UV lamps 72 is extended in the forward/backward direction, and the UV lamps 72 are arranged with a gap therebetween. In the present exemplary embodiment, four UV lamps 72 are provided.

A wavelength of the UV rays irradiated from the UV lamp 72 may not be particularly limited as long as the UV rays are capable of generating active oxygen or ozone for removing a SOC film from oxygen included in the atmosphere within the processing space 60. As the wavelength of the UV rays decreases, energy may be increased, whereas the UV rays may become easier to be absorbed into a gas within the processing space 60. In consideration of a balance between these two aspects, the UV lamps 72 used in the present exemplary embodiment irradiate UV rays of a wavelength of 172 nm.

These UV lamps 72 are connected to a power supply device 74, and they are turned on as a power is supplied from this power supply device 74 and turned off as the power supply is stopped.

Figure 11:
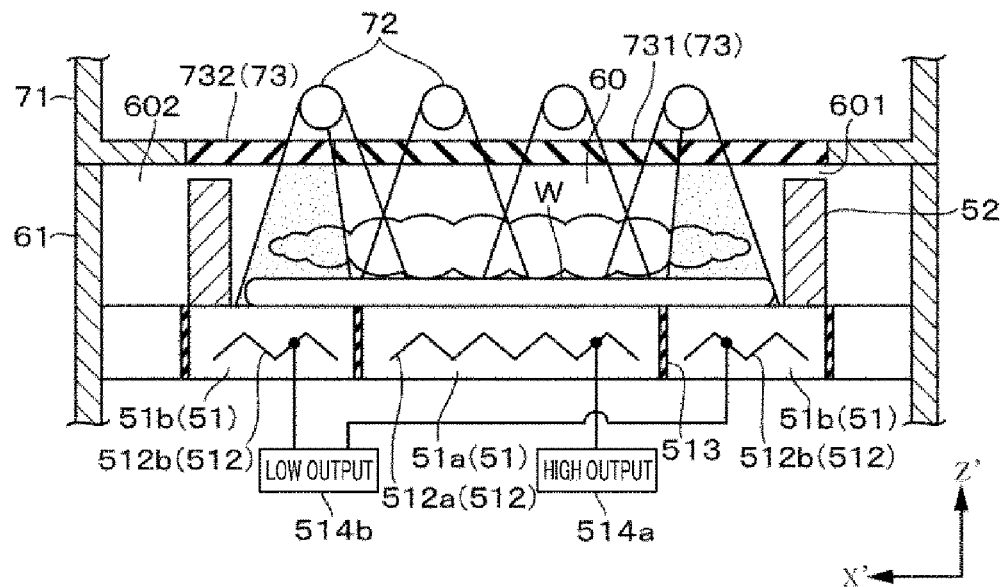
FIG. 11 is a first explanatory diagram showing an operation of the wafer processing apparatus.

As illustrated in FIG. 5, FIG. 11 and so on, the UV transmission member 73 that transmits the UV rays irradiated from the UV lamps 72 toward the inside of the processing space 60 is provided between the processing chamber 61 and the lamp chamber 71 which are stacked on top of each other in the vertical direction. The UV transmission member 73 is made of, by way of non-limiting example, a glass plate that transmits the UV rays.

The UV lamps 72, the power supply device 74, the UV transmission member 73, and so forth correspond to an ultraviolet ray irradiation device according to the present exemplary embodiment.

The wafer processing apparatus 140 having the above-described configuration performs a SOC film forming process of forming the SOC film as the processing target film by heating the wafer W within the processing space 60 and a wafer surface planarizing process of planarizing the surface of the wafer W by removing a part of the SOC film through the irradiation of the UV rays to the wafer W, as already mentioned above.

Among these processes, the SOC film forming process is performed under a condition where the one-direction flow of the clean air that flows from the gas introduction room 621 to the gas exhaust room 641. Accordingly, components cause from the source material of the SOC film during the heating of the wafer W can be exhausted from the processing space 60.

Meanwhile, the present inventors found out that if the UV rays are irradiated to the wafer W under the condition where the one-direction flow of the clean air, i.e., the same condition as that in case of forming the SOC film, it becomes difficult to remove the SOC film uniformly, which suppresses the surface of the wafer W from being planarized.

Figure 9:
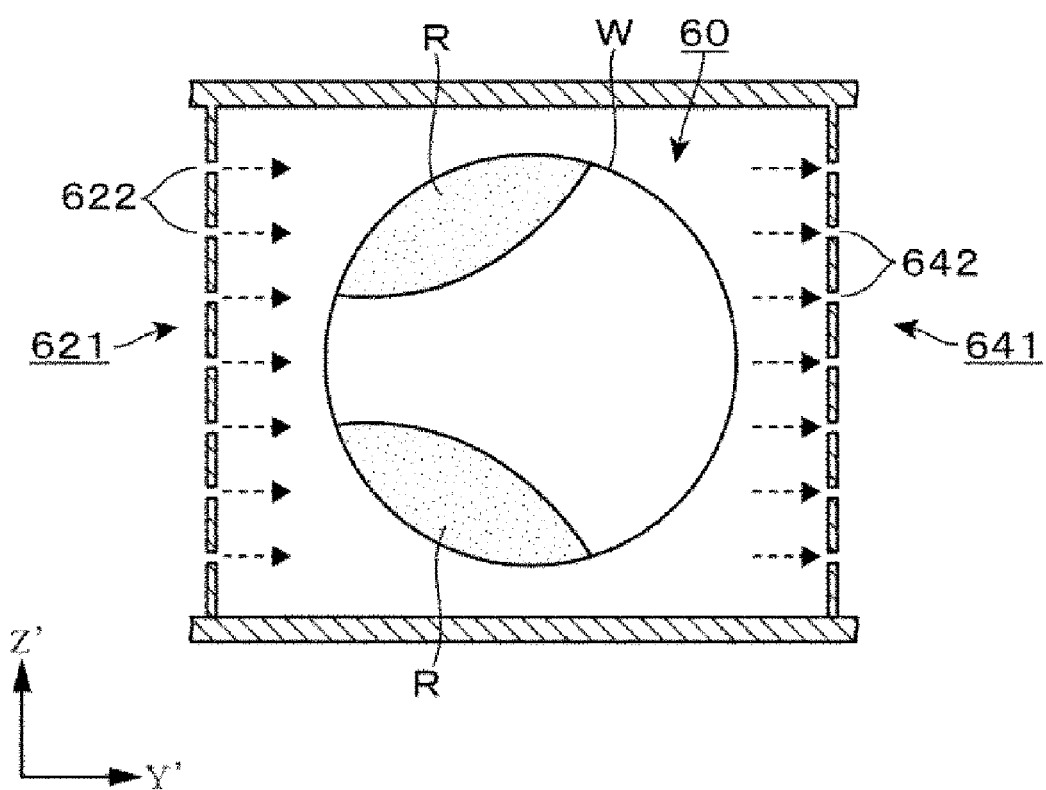
FIG. 9 is a schematic diagram showing a thickness distribution of a SOC film in case of irradiating a UV ray while supplying a one-direction air flow.

As depicted in FIG. 9, if the UV rays are irradiated toward the processing space 60 in which the one-direction flow of the clean air from the gas introduction room 621 to the gas exhaust room 641 is formed, an atmosphere including abundant active oxygen or ozone is created at an upstream side in the flow direction. Further, within the flat processing chamber 61, the air flow velocity becomes slower in a region close to the left and right sidewall surfaces, when viewed from the front side, than in a region on a central region. As a result, a state in which the active oxygen or ozone is abundant is created at a front side and at left and right side positions within the processing space 60. Accordingly, the wafer W placed in the processing space 60 may have a region (film thickness decrease region R) where the film removing amount is increased, i.e., the region where the active oxygen or ozone is abundant. Resultantly, the SOC film may not be removed uniformly.

In order to solve this problem, in the wafer processing apparatus 140 according to the present exemplary embodiment, a circular ring-shaped surrounding member 52 that surrounds the wafer W placed on the placing table 51 is provided as shown in FIG. 5 and FIG. 6, so that the gas introduction into the space above the wafer W to which the UV rays are irradiated can be suppressed. Further, during the irradiation of the UV rays, the supply of the clean air from the gas introduction room 621 and a compulsory exhaust from the gas exhaust room 641 are stopped. By irradiating the UV rays in this stationary atmosphere, it is possible to suppress the film thickness decrease region R, illustrated in FIG. 9, from being generated.

As will be elaborated later, since the convection is created within the processing space 60 surrounded by the surrounding member 52, the gas flow velocity within the processing space 60 may not become zero in the present exemplary embodiment. However, if the gas flow velocity within the processing space 60 is equal to or less than 10 cm/s, it is possible to suppress the film thickness decrease region R from being generated, and the planarizing process of the wafer W can be performed uniformly.

Meanwhile, if the UV rays are irradiated within the narrow space surrounded by the surrounding member 52 even without supplying oxygen from the outside, there may be a lack of active oxygen or ozone required for removing the SOC film. To solve this problem, a gap (oxygen inlet opening 601) is formed between an upper end of the surrounding member 52 and a ceiling surface of the processing chamber 61, as shown in FIG. 11 and an enlarged view of FIG. 12. As a result, clean air including oxygen can be introduced into the space surrounded by the surrounding member 52 from the outside (an oxygen supply space 602 shown in FIG. 6 and so forth) of the surrounding member 52.

The height of the oxygen inlet opening 601 is set to be larger than zero and equal to or smaller than 3 mm, for example, 0.8 mm. Here, however, the oxygen inlet opening 601 may not be merely limited to the gap between the upper end of the surrounding member 52 and the ceiling surface of the processing chamber 61. Alternatively, a slit-shaped oxygen inlet opening 601 may be formed along a circumferential direction of the surrounding member 52, and this opening may be closed during the process by the UV rays.

Figure 12:
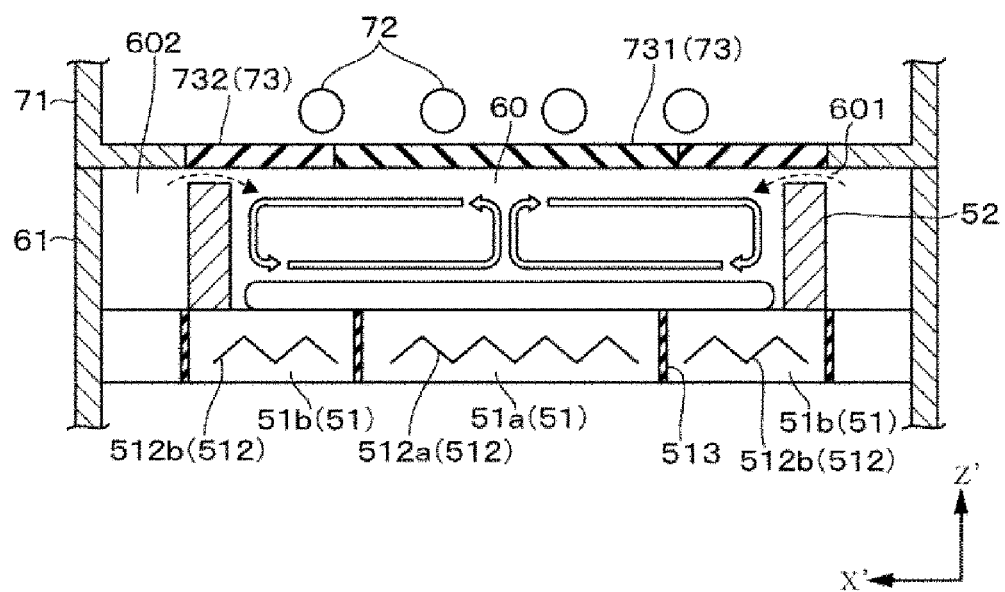
FIG. 12 is a second explanatory diagram showing an operation of the wafer processing apparatus.

In the illustration of FIG. 11 and FIG. 12, the height dimensions of the processing space 60 and the surrounding member 52 are exaggerated.

As will be presented in experimental results to be described later, the present inventors have also found out that even in case of irradiating the UV rays to the wafer W within the processing space 60 surrounded by the surrounding member 52, a removing rate of the SOC film can also be increased by increasing a temperature of the placing table 51 with the heater 512 to heat the wafer W. Further, the present inventors have also found out that if the UV rays are irradiated while a temperature of the entire surface of the wafer W is maintained uniform, it is possible to obtain a film thickness distribution where the film removing amount becomes larger at a peripheral portion of the wafer W and becomes smaller toward a central portion of the wafer W.

The reason for the above-mentioned film thickness distribution may be because by-products, which are generated when the SOC film is decomposed, float within the processing space 60 and absorb the UV rays, so that the generation of active oxygen or ozone can be suppressed, and, also, because these by-products react with the active oxygen or ozone, so that the reaction of the active oxygen or ozone with the SOC film can be suppressed (FIG. 11). Further, the reason why the film removing amount at the peripheral region of the wafer W becomes larger than at the central region of the wafer W may be because an amount of the by-products generated at the peripheral region of the wafer W in the vicinity of the surrounding member 52 is smaller than an amount generated at the central region of the wafer W, and, also, because oxygen as a source of the active oxygen or ozone is supplied through the oxygen inlet opening 601.

To solve the problem, in the wafer processing apparatus 140 according to the present exemplary embodiment, the placing table 51 is concentrically divided in the diametrical direction of the wafer W into a first placing table region (first heating device) 51a and a second placing table region (second heating device) 51b, as illustrated in FIG. 11. A power from a power supply device 514a configured to supply a power to a first heater 512a in the first placing table region 51a provided at a central side of the placing table 51 may be different from a power supply device 514b configured to supply a power to a second heater 512b in the second placing table region 51b provided at a peripheral side thereof. Further, as depicted in FIG. 11, a heat insulating member 513 is provided between the first placing table region 51a and the second placing table region 51b.

In the present exemplary embodiment, a temperature of the first placing table region 51a on the central side is set to be in the range from 200° C. to 350° C., e.g., 300° C., and a temperature of the second placing table region 51b is set to be in the range from 200° C. to 350° C., e.g., 250° C. Accordingly, by increasing a removing rate of the SOC film at the central portion of the wafer W, where the film removing amount becomes smaller when heating the wafer surface uniformly, the film thickness distribution of the SOC film after the irradiation of the UV rays can be uniformed.

The example shown in FIG. 11 has been described for the case where the placing table 51 is divided into two in the diametrical direction of the wafer W. However, by dividing the placing table 51 into three or more, it may be possible to adjust the film thickness with higher precision.

Further, in the wafer processing apparatus 140 according to the exemplary embodiment, it is also possible to achieve the uniform thickness distribution of the SOC film after irradiating the UV-ray thereto by changing materials for the UV transmission member 73 corresponding to the irradiation regions of the wafer W.

That is, as illustrated in FIG. 7, FIG. 11 and so forth, the UV transmission member 73 is divided into two in the diametrical direction of the wafer W: a first UV transmission member 731 and a second UV transmission member 732. The first UV transmission member 731 is made of a glass plate having higher UV transmittance, whereas the second UV transmission member 732 is made of an opaque glass plate having a relatively lower UV transmittance.

Due to this difference in the materials, a UV ray passing through the first UV transmission member 731 is irradiated into the processing space 60 at an illuminance ranging from 30 mW/cm² to 60 mW/cm², e.g., 40 mW/cm², whereas a UV ray passing through the second UV transmission member 732 is irradiated into the processing space 60 at an illuminance ranging from 20 mW/cm² to 45 mW/cm², e.g., 30 mW/cm². As a result, a generation amount of active oxygen or ozone may become relatively smaller at the peripheral portion of the wafer W. Therefore, the thickness distribution of the SOC film after the UV-ray irradiation can be uniformed.

The first UV transmission member 731 and the second UV transmission member 732 correspond to an illuminance adjusting device in the present exemplary embodiment. Here, the UV transmission member 73 may be divided into three or more in the diametrical direction of the wafer W, so that the illuminance of the UV rays can be adjusted with higher precision.

The wafer processing system 1, the coating apparatuses 130 to 133, and the wafer processing apparatuses 140 to 142 and 150 to 152 having the above-described configurations are connected to a controller 8. The controller 8 is implemented by a computer having a CPU and a memory. Recorded on the memory are programs including step (command) sets for the control of operations of the wafer processing system 1, the coating apparatuses 130 to 133 and the wafer processing apparatuses 140 to 142 and 150 to 152, i.e., for the control of operations of taking out the wafer W from the cassette C and delivering the wafer W into the coating apparatuses 130 to 133 or the wafer processing apparatuses 140 to 142 and 150 to 152; forming the SOC film by coating and heating the source material; planarizing the surface of the wafer W by removing a part of the SOC film by the UV irradiation; and then returning the wafer W back into the cassette C. These programs may be stored on a recording medium such as, but not limited to, a hard disk, a compact disk, a magnetic optical disk, a memory card, or the like and may be installed in the computer therefrom.

Figure 10:
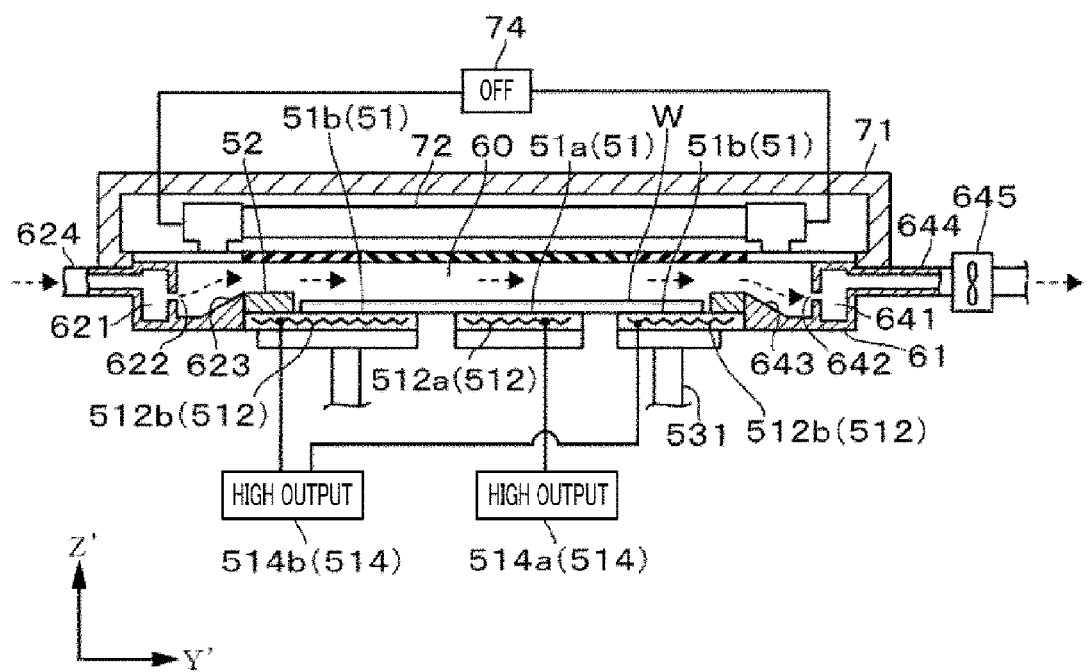
FIG. 10 is an enlarged longitudinal side view illustrating a state of the wafer processing apparatus in a heating process.

Now, referring to FIG. 10 to FIG. 13G, an operation of the wafer processing system 1 will be described. FIG. 10 illustrates a state of the processing space 60 during the heating process for forming the SOC film. FIG. 11 and FIG. 12 depict a state of the processing space 60 during the irradiation of the UV rays. FIG. 13A to FIG. 13G schematically illustrate a longitudinal cross section in the vicinity of the surface of the wafer W being processed.

As illustrated in FIG. 13A to FIG. 13G, a $SiO_2$ film, for example, is previously patterned on the surface of the wafer W to be processed in the wafer processing system 1. Patterns P are densely and sparsely formed. There are a blanket region A where only patterns P are formed and a line-and-space region B where the patterns P and recesses Q are alternately formed.

If the cassette C accommodating the wafer W having thereon the patterns P is placed on the cassette placing table 111, the wafer W is taken out of the cassette C by the wafer transfer device 113. Then, the wafer W is transferred onto the delivery table 121 of the processing station 120 and delivered into any one of the temperature control apparatuses 143, 144, 153 and 154 by the wafer transfer device 122. In the temperature control apparatus, a temperature of the wafer W is adjusted to be a set value.

Thereafter, the wafer W is transferred into the coating apparatus 130 by the wafer transfer device 122. The wafer W carried in the coating apparatus 130 is delivered from the wafer transfer device 122 onto the spin chuck 210 to be attracted thereto and held thereon. Subsequently, the coating nozzle 222 which has been on standby in the nozzle bus 224 is moved to the position above the central portion of the wafer W and supplies the source material of the SOC film onto the wafer W being rotated by the spin chuck 210. The source material supplied onto the wafer W being rotated is dispersed on the entire surface of the wafer W in a film shape by a centrifugal force.

Figure 13A:
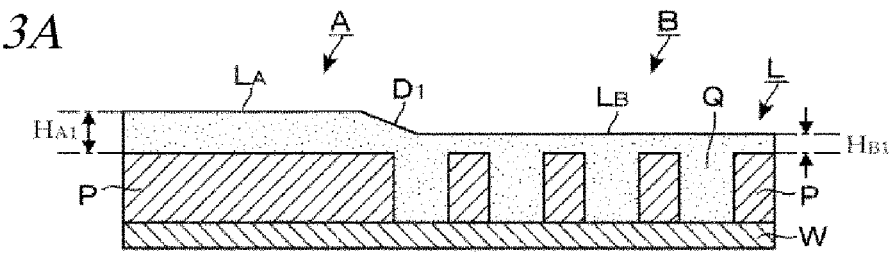
FIG. 13A to FIG. 13G are explanatory diagrams depicting processes performed on a wafer in the wafer processing system.

At this time, as depicted in FIG. 13A, as for the source material L coated on the wafer W with a surface tension or a viscosity, the source material L (hereinafter, referred to as "source material $L_B$") coated on the line-and-space region B becomes recessed downwards as compared to the source material L (hereinafter, referred to as "source material $L_A$") coated on the blanket region A. That is, a height $H_{B1}$ from the tip end portions of the patterns P to a surface of the source material $L_B$ is smaller than a height $H_{A1}$ from the tip end portions of the patterns P to a surface of the source material $L_A$. As a result, a step-shaped portion $D_1$ is formed between the source material $L_A$ and the source material $L_B$.

Thereafter, the wafer W is carried out of any one of the coating apparatuses 130 to 133 by the wafer transfer device 122 and transferred into any one of the wafer processing apparatuses 140 to 142, 150 to 152 (hereinafter, the reference number of the wafer processing apparatus 140 will only be specified for the simplicity of illustration). When the wafer transfer device 122 enters the wafer processing apparatus 140 through the carry-in/out opening 301, the transfer arm 41 is moved to the front position and the placing table 51 stands by in a state where the placing table 51 is lowered downwards.

After the shutter 302 is opened, the wafer transfer device 122 enters the wafer processing apparatus 140 through the carry-in/out opening 301 and stops at a position above the transfer arm 41. Then, the supporting pins 421 are lifted up and receive the wafer W from the wafer transfer device 122. Afterwards, the wafer transfer device 122 is retreated out of the wafer processing apparatus 140, and the shutter 302 is closed.

If the supporting pins 421 supporting the wafer W thereon are lowered down, the wafer W is delivered onto the transfer arm 41 from the supporting pins 421, and the transfer arm 41 is moved towards the rear side where the placing table 51 stands by. If the transfer arm 41 stops at a position above the placing table 51, the supporting pins 541 are raised up, and the wafer W is delivered onto the supporting pins 541 from the transfer arm 41 (see FIG. 8).

Thereafter, the transfer arm 41 is moved to the standby position at the front side, and the placing table 51 is raised up to receive the wafer W from the supporting pins 541. As a result, the wafer W is placed on the placing table 51 surrounded by the surrounding member 52. The placing table 51 holding the wafer W thereon is moved up to a position at a bottom side of the processing chamber 61 to close the opening 63.

Here, as illustrated in FIG. 11, if the placing table 51 is raised up to a position where the gap between the upper end of the surrounding member 52 and the ceiling surface of the processing chamber 61 is 0.8 mm, a uniform one-direction flow of clean air is difficult to form above the wafer W surrounded by the surrounding member 52. To solve the problem, as depicted in FIG. 10, the lifting of the placing table 51 is stopped at the timing, for example, when the upper end of the surrounding member 52 and the upper ends of the tapered portions 623 and 643 are substantially arranged on the same plane.

Accordingly, the one-direction flow of the clean air flowing from the gas introduction room 621 toward the gas exhaust room 641 is formed within the processing space 60 formed between the processing chamber 61 and the placing table 51. The power supply device 514 (514a and 514b) supplies a power to the heater 512 (512a and 512b), so that the wafer W is heated to, for example, 300° C. At this time, the outputs of the power supply devices 514a and 514b are same, and, thus, the entire surface of the wafer W is heated to have the same temperature.

Figure 13B:
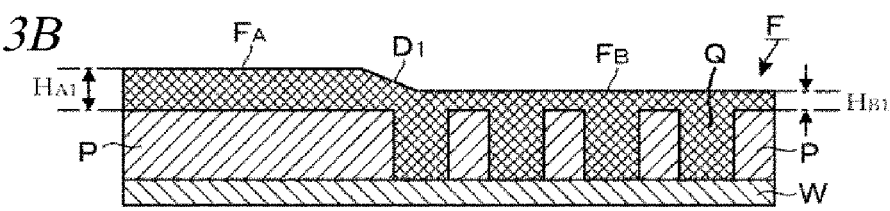
Figure 13C:
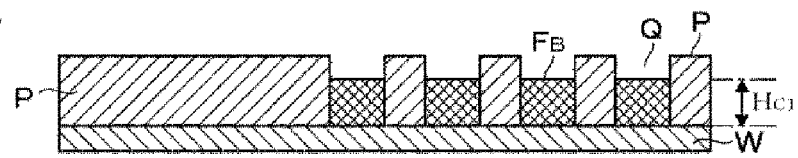

After the wafer W is heated for a predetermined time period, a SOC film F as an organic film is formed from the source material L (FIG. 13B). Even at this time, the aforementioned step-shaped portion $D_1$ is formed between the SOC film F (hereinafter, referred to as "SOC film $F_A$") on the region A and the SOC film F (hereinafter, referred to as "SOC film $F_B$") on the region B.

By-products generated when the SOC film is formed are carried on the one-direction flow of the clean air to be exhausted from the processing space 60 through the gas exhaust room 641 (FIG. 10).

Subsequently, the supply of the clean air from the gas introduction room 621 and the exhaust of the inside of the processing space 60 by the gas exhaust room 641 are stopped, and the placing table 51 is moved up to a position where the oxygen inlet opening 601 between the upper end of the surrounding member 52 and the ceiling surface of the processing chamber 61 has a height of 0.8 mm (FIG. 11). Further, the output of the power supply device 514b is reduced, and the heating temperature of the wafer W on the second placing table region 51b is adjusted to 250° C.

Thereafter, a power is fed from the power supply device 74, and each of the UV lamps 72 is turned on and irradiates the UV rays into the processing space 60. Active oxygen or ozone is generated from oxygen in the clean air (oxygen-containing atmosphere) within the processing space 60 by the irradiated UV rays. A surface of the SOC film F (a part of the SOC film F) is decomposed to be removed by the active oxygen and ozone, and a so-called etch-back is performed.

At this time, the exhaust of the inside of the processing space 60 is stopped, and the UV rays are irradiated into the processing space 60 surrounded by the surrounding member 52. Thus, since the SOC film is partially removed under an atmosphere where a gas flow velocity is equal to or less than 10 cm/sec, the uniform process can be performed on the entire surface of the wafer W. Further, the placing table 51 on which the wafer W is placed is heated by the heater 512, whereas the ceiling surface of the processing space 60 is not heated to such a high temperature ranging from 250° C. to 300° C. As a result, a temperature distribution in which a gas temperature decreases as it goes upwards toward an upper portion of the processing space 60 from a lower portion thereof is generated, so that a convection where the gas is circulated above the wafer W in a vertical direction is also generated, as shown in FIG. 12. Thus, the gas within the processing chamber 60 is uniformly circulated. This convection also allows the uniform process to be performed on the entire surface of the wafer W.

Further, since the surrounding member 52 is provided with the oxygen inlet opening 601, if the active oxygen or ozone is consumed within the processing space 60 surrounded by the surrounding member 52 and, thus, a concentration of these active components is reduced, an atmosphere containing oxygen (which may exist as active oxygen or ozone by being irradiated by the UV rays) is introduced into a region inside the surrounding member 52. That is, a space outside the surrounding member 52 serves as a so-called oxygen supplement space and thus contributes to the process of removing a part of the SOC film.

At the peripheral portion of the wafer W, a temperature of the second placing table region 51b is adjusted to a temperature lower than that of the first placing table region 51a, and a UV-ray transmittance of the second UV transmission member 732 is lower than that of the first UV transmission member 731 at the central side thereof. Accordingly, since a removing rate of the SOC film at the peripheral region of the wafer W, which is less affected by the by-products, is suppressed to be low, the partial removal of the SOC film can be performed uniformly over the entire surface.

By irradiating the UV-rays as above-described, the SOC film of the height $H_{A1}$ is removed up to a depth where the SOC film $F_A$ on the region A is completely removed. As a result, surfaces of the patterns P of the wafer W are exposed, and the SOC film $F_A$ no more exists on the region A, and the SOC film $F_B$ of a height $H_{C1}$ remains within the recesses Q of the patterns P.

After the irradiation of the UV rays is performed for a preset time period, the UV lamps 72 are turned off and the power supply to the heater 512 is stopped, and the placing table 51 is lowered to a position indicated in FIG. 10. Thereafter, the one-direction flow of the clean air is formed within the processing space 60 again by performing the supply of the clean air from the gas introduction room 621 and the exhaust from the gas exhaust room 641, and the active oxygen or ozone, the by-products, and so forth are exhausted from the processing space 60.

Afterwards, the placing table 51 is moved down, and the processed wafer W is delivered onto the transfer arm 41 in the reverse order to that taken when loading the wafer W. The transfer arm 41 that has received the wafer W is moved to the front position where the wafer W is delivered to/from the wafer transfer device 122 and stands by for a predetermined time period and waits for the wafer W to be cooled to a preset temperature. The temperature-adjusted wafer W is delivered onto the wafer transfer device 122 in the reverse order to that taken when loading the wafer W and taken out of the wafer processing apparatus 140.

The source material coating process by the coating apparatuses 130 to 133, the heating process for the wafer W in the wafer processing apparatuses 140 to 142 and 150 to 152, and the UV-ray irradiation process are performed multiple times, for example, n times in this sequence.

For example, in a second source material coating process, the source material L of the SOC film is coated again on the wafer W in any one of the coating apparatuses 130 to 133.

In the second source material coating process, a film thickness of the source material L is controlled to be smaller than that in the first source material coating process. To elaborate, a method of increasing a rotational speed of the spin chuck 210 or a method of reducing a supply amount of the source material L onto the wafer W may be adopted, for example. As a result, as depicted in FIG. 13D, heights $H_{A2}$ and $H_{B2}$ of SOC films $F_A$ and $F_B$ (source materials $L_A$ and $L_B$) in the second source material coating process become smaller than the heights $H_{A1}$ and $H_{B1}$ of the SOC films $F_A$ and $F_B$ in the first source material coating process, respectively.

Figure 13D:
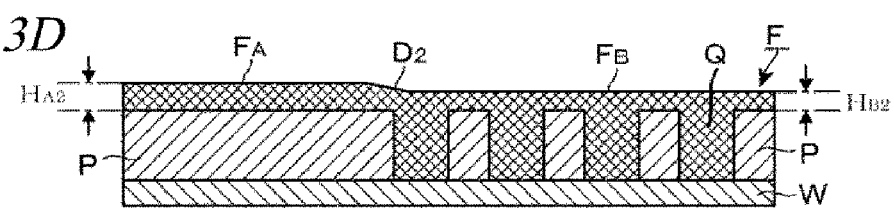

Afterwards, the source material L on the wafer W is heated within the processing space 60 of the wafer processing apparatus 140, so that a SOC film F is formed (FIG. 13D). At this time, a step-shaped portion $D_2$ formed between the SOC film $F_A$ and the SOC film $F_B$ is smaller than the step-shaped portion $D_1$ in the first source material coating process.

Figure 13E:
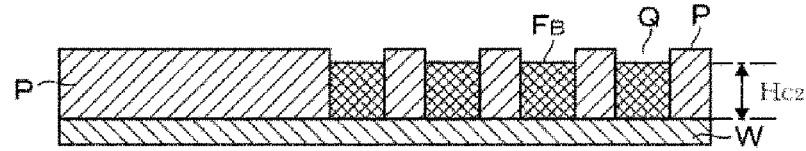

Then, by irradiating the UV rays onto the wafer W within the processing space 60 of the wafer processing apparatus 141, the SOC film F of the height $H_{A2}$ is removed to a depth where the SOC film $F_A$ on the region A is completely removed, as shown in FIG. 13E. As a result, SOC film $F_A$ no more exists on the region A, and the SOC film $F_B$ of a height $H_{C2}$ remains in the recesses Q of the patterns P on the region B. The height $H_{C2}$ of the SOC film $F_B$ remaining after the second UV-ray irradiation becomes larger than the height $H_{C1}$ of the SOC film $F_B$ remaining after the first UV-ray irradiation. That is, whenever the series of processing sequences (i.e., coating the source material→forming the SOC film→removing a part of the SOC film) are repeated, the SOC film $F_B$ is deposited within the recesses Q of the patterns P.

Figure 13F:
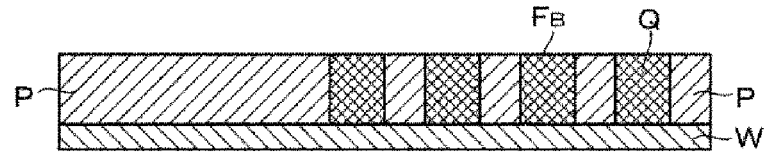

Just like the series of processing sequences of the second processing described→above, a series of processing sequences (i.e., coating the source material→forming the SOC film removing a part of the SOC film) are also repeated in a third to a $n^{th}$ processing. As a result, step-shaped portions $D_3$ to $D_n$ between the SOC film $F_A$ and the SOC film $F_B$ are gradually reduced, and a step-shaped portion $D_n$ finally becomes almost zero. Then, as depicted in FIG. 13F, the height of the surface of the SOC film $F_B$ equals to the height of the surface of the patterns P. Here, the step-shaped portion $D_n$ may not necessarily be zero but it only needs to be in a required preset range.

Thereafter, the source material L is coated on the wafer W in a preset film thickness in any one of the coating apparatuses 130 to 133, and only the heating process of heating the source material L on the wafer W is performed within the processing space 60 of the wafer processing apparatus 140. As a result, as shown in FIG. 13G, a SOC film F having a predetermined thickness and a planarized surface is finally formed on the wafer W.

Figure 13G:
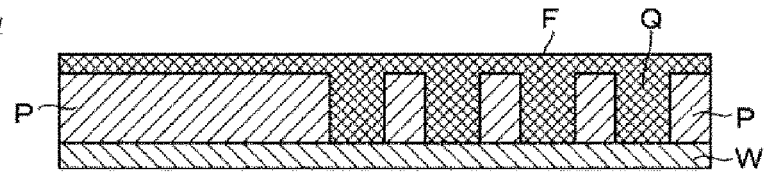

Once the SOC film F is formed as shown in FIG. 13G, the wafer W is delivered to the transfer arm 41 without performing the UV-ray irradiation thereto. Then, after the temperature adjustment is performed, the wafer W is carried out of the wafer processing apparatus 140 by the wafer transfer device 122. Thereafter, the wafer W is transferred into the cassette station 110 from the processing station 120 via the delivery table 121 and the wafer transfer device 113 in sequence and returned back into the cassette C on the cassette placing table 111. Then, the SOC film forming process for planarizing the surface of the wafer W in the wafer processing system 1 is completed.

With the wafer processing system 1 and the wafer processing apparatuses 140 to 142 and 150 to 152 according to the present exemplary embodiment, the following effects can be achieved. Since a part of the SOC film is removed by irradiating UV rays thereto, the removal can be performed under a normal pressure atmosphere while suppressing an influence upon the wafer W. At this time, the UV-ray irradiation is performed in the processing chamber 61 having the exhaust device (the gas exhaust room 641, the gas exhaust fan 645, or the like) under the conditions where the exhaust of the inside (processing space 60) of the processing chamber 61 is stopped and the gas flow velocity is equal to or less than 10 cm/sec. Accordingly, the partial removal of the SOC film can be carried out uniformly on the surface of the wafer W while suppressing an influence caused by the gas flow.

Now, referring to FIG. 14 to FIG. 16, a wafer processing apparatus 140a according to a second exemplary embodiment will be discussed. In the wafer processing apparatus 140a, a gas introduction room 621 for supplying an oxygen-containing gas into a processing space 60 and a gas exhaust room 641 for discharging a gas exhausted form the processing space 60 are provided below the placing table 51. In this aspect, the second exemplary embodiment is different from the first exemplary embodiment in which the gas introduction room 621, the gas exhaust room 641 and the processing space 60 are arranged horizontally (see FIG. 5 and FIG. 10).

Further, in each of various exemplary embodiments to be described with reference to FIG. 14 to FIG. 18E, constituent components having the same functions as those of the wafer processing apparatus 140 of the first exemplary embodiment will be assigned the same reference numerals as depicted in FIG. 5 to FIG. 12. Further, in FIG. 14 to FIG. 18E, illustration of divisions (a first and a second UV transmission member 731 and 732) of a UV transmission member 73 and divisions (a first and a second placing table region 51a and 51b) of the placing table 51 are omitted.

Figure 14:
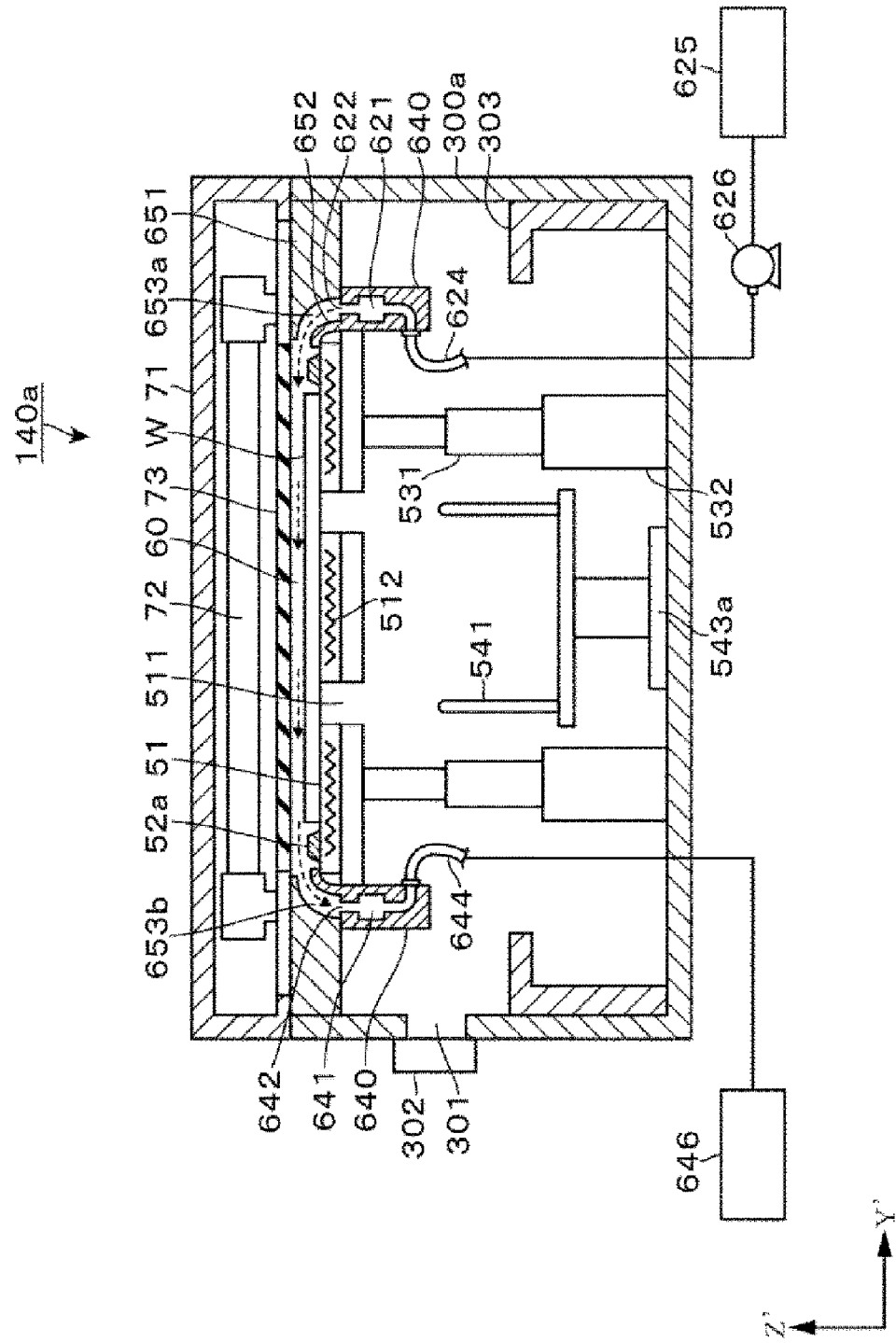
FIG. 14 is a longitudinal side view of a wafer processing apparatus according to a second exemplary embodiment.
Figure 15:
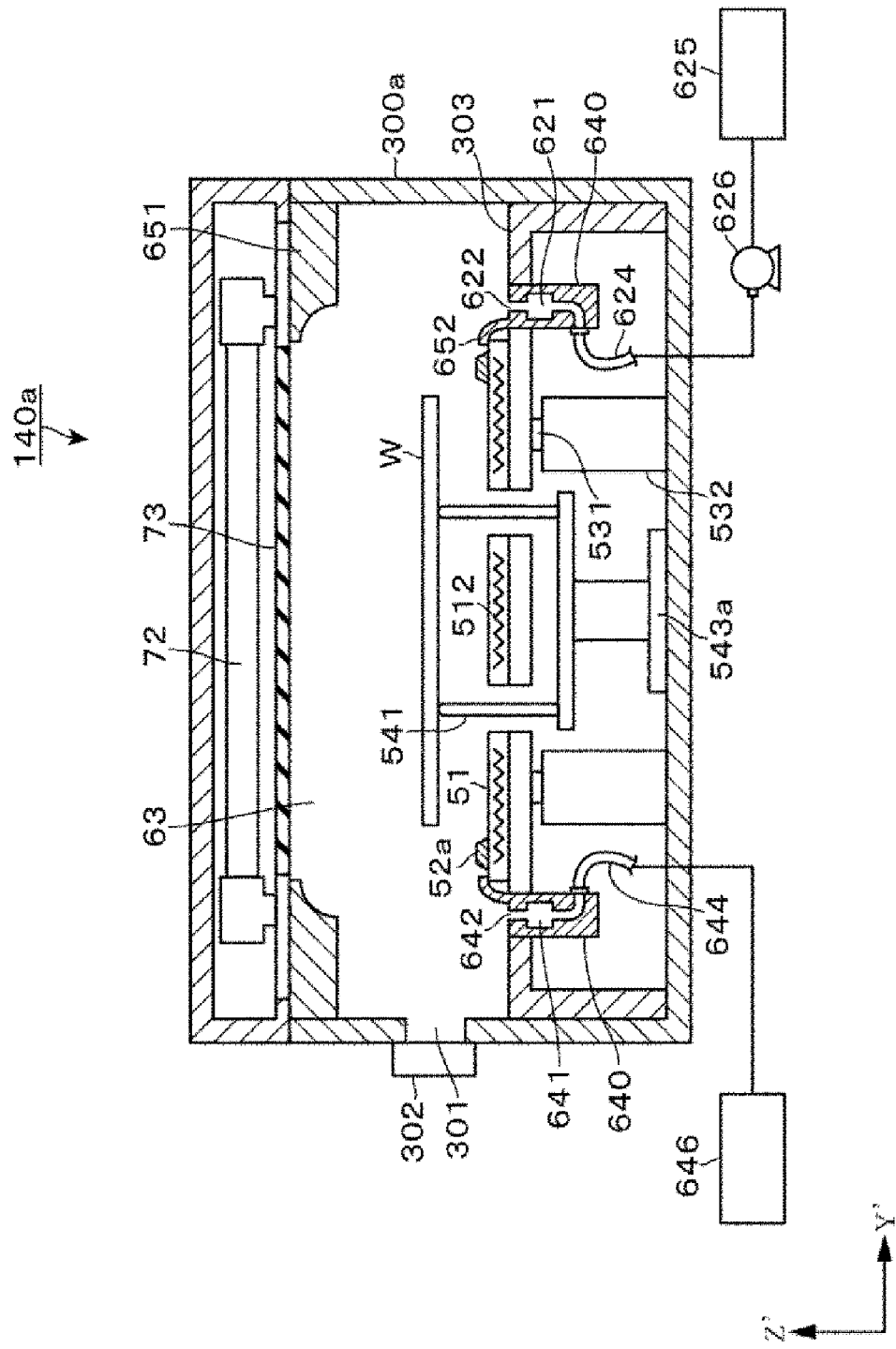
FIG. 15 is another longitudinal side view of the wafer processing apparatus according to the second exemplary embodiment.
Figure 16:
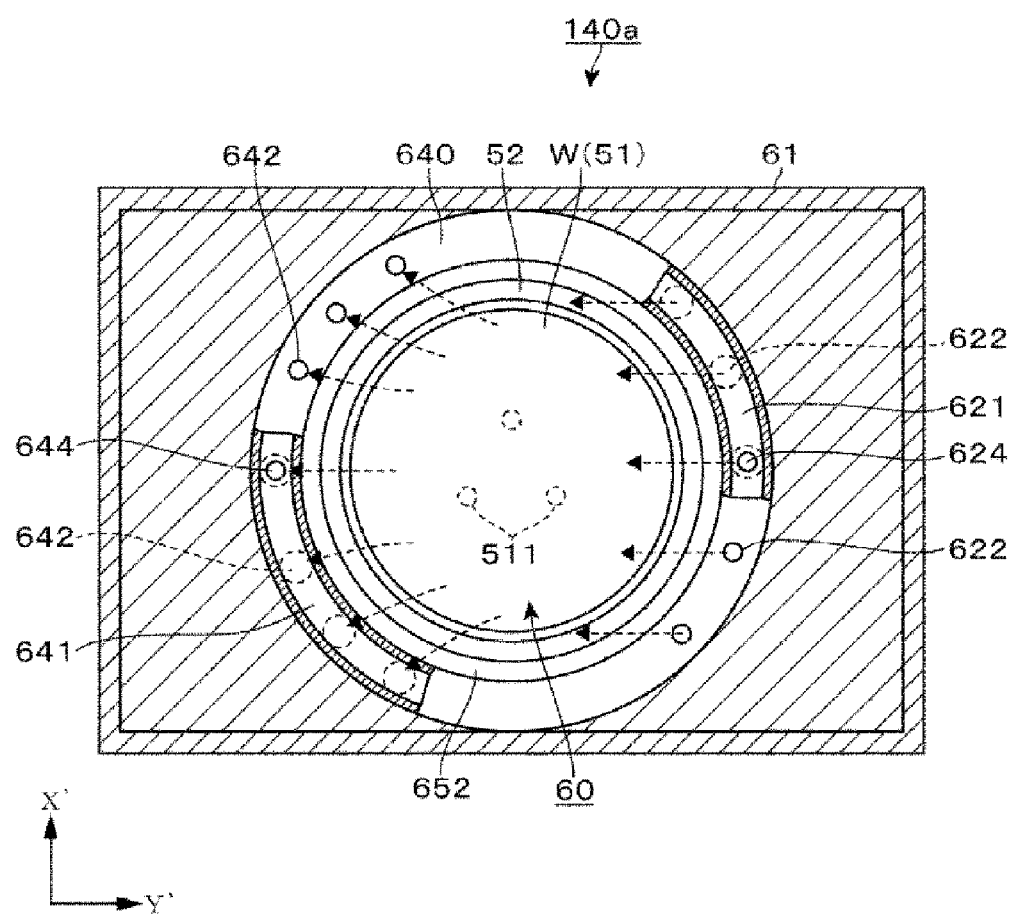
FIG. 16 is a horizontal plan view of the wafer processing apparatus according to the second exemplary embodiment.

As illustrated in FIG. 14 to FIG. 16, the placing table 51 of the wafer processing apparatus 140a according to the present exemplary embodiment is provided with a cylindrical flange 640 that surrounds a side peripheral surface of the placing table 51. A lower end of the flange 640 is extended downwards. The flange 640 is fixed to the placing table 51 to be moved in a vertical direction together with the placing table 51 as the supporting members 531 are extended and contracted.

As shown in FIG. 16, provided within the flange 640 at the rear side when viewed from the placing table 51 is a gas introduction room 621 which is formed as an arc-shaped groove along the placing table 51. As depicted in FIG. 14, the gas introduction room 621 is connected with an air supply line 624, and clean air as an oxygen-containing gas is supplied from a clean air supply device 625. In the wafer processing apparatus 140a according to this second exemplary embodiment, the clean air is force-fed by using an air pump 626 provided on the air supply line 624. Further, the air supply line 624 provided within a housing 300a is made of a flexible hose or the like to be transformed according to the vertical movement of the flange 640.

A top surface of the gas introduction room 621 is covered with a top surface member of the flange 640, and the top surface member covering the gas introduction room 621 is provided with a multiple number of gas introduction holes 622 along the circumference of the placing table 51. The clean air diffused within the gas introduction room 621 is discharged from the gas introduction holes 622 in a dispersed manner (FIG. 16). As shown in FIG. 14, the gas introduction holes 622 are formed at a height position lower than the processing space 60 (i.e., lower than the wafer W placed on the placing table 51) that accommodates the wafer W therein.

Meanwhile, provided within the flange 640 at the front side when viewed from the placing table 51 is provided a gas exhaust room 641 which is formed as an arc-shaped groove along the placing table 51. (FIG. 16). As depicted in FIG. 14, the gas exhaust room 641 is connected with a gas exhaust line 644, and a gas exhausted from the processing space 60 is introduced into the gas exhaust room 641 and then is discharged to an external harm-removing facility 646. Further, the gas exhaust line 644 is also made of a flexible hose or the like such that it may be transformed according to the vertical movement of the flange 640. Instead of or together with the force-feeding of the clean air using the air pump 626 provided on the side of the air supply line 624, a gas exhaust by a gas exhaust fan 645 provided on the side of the gas exhaust line 644 may be performed.

Further, a top surface of the gas exhaust room 641 is covered with the top surface member of the flange 640, and the top surface member covering the gas exhaust room 641 is provided with a multiple number of gas exhaust holes 642 along the circumference of the placing table 51. A gas exhausted from the gas introduction room 621 is discharged into the gas exhaust room 641 through the gas exhaust holes 642 (FIG. 16). As shown in FIG. 14, the gas exhaust holes 642 are also formed at a height position lower than the processing space 60 (i.e., lower than the wafer W placed on the placing table 51).

Further, within the flange 640, the gas introduction room 621 and the gas exhaust room 641 are distanced apart from each other such that the clean air supplied into the gas introduction room 621 is not directly introduced into the gas exhaust room 641.

A circular ring-shaped lower-side flow path forming member 652 having a protruded and curved surface, which is bent from a peripheral portion of the placing table 51 toward a surrounding member 52a provided on the placing table 51, is provided on an upper end portion of the flange 640. Meanwhile, an upper-side flow path forming member 651 having an opening 63 (see FIG. 15), which conforms to the placing table 51 and the flange 640, is provided at a ceiling surface of a housing 300a. The upper-side flow path forming member 651 is provided with a recessed and curved surface, which is formed along the circumference of the opening 63.

At the regions where the gas introduction holes 622 and the gas exhaust holes 642 are formed, the recessed curved surface of the upper-side flow path forming member 651 is disposed to face the protruded and curved surface of the lower-side flow path forming member 652 with a gap of several millimeters (mm) apart from the protruded and curved surface of the lower-side flow path forming member 652 when the placing table 51 is raised up to the processing position. As shown in FIG. 14, gaps surrounded by the opposing curved surfaces of the upper and lower-side flow path forming members 651 and 652 serves as slit-shaped flow paths 653a and 653b through which the clean air supplied into the processing space 60 and the gas exhausted from the processing space 60 are flown, respectively. In the wafer processing apparatus 140a according to the this second exemplary embedment, a flat circular plate-shaped space surrounded by the upper-side flow path forming member 651, the placing table 51 and the ceiling surface (UV transmission member 73) of the housing 300a serves as the processing space 60. Accordingly, in a region outside a surrounding member 52a, the oxygen supply space 602 as depicted in FIG. 6 and so forth is not formed.

Meanwhile, at a the remaining region where the gas introduction holes 622 and the gas exhaust holes 642 are not formed, by allowing the curved surfaces of the upper-side and lower-side flow path forming members 651 and 652 to be located as closely to each other as possible, a gas flow path may not be formed therebetween. Thus, the clean air supplied from the gas introduction holes 622 may not flow into the gas exhaust holes 642 by bypassing the processing space 60.

In the wafer processing apparatus 140a having the above-described configuration, if the placing table 51 is moved up to the processing position, the processing space 60 is formed between the UV transmission member 73 and the placing table 51, and the flow path 653a for the supply of the clean air and the flow path 653b for the exhaust of the gas from the processing space 60 are formed between the lower-side flow path forming member 652 and the upper-side flow path forming member 651. If the clean air is supplied into the gas introduction room 621 from the air supply line 624, the clean air is introduced into the processing space 60 via the flow path 653a, so that an oxygen-containing atmosphere is created within the processing space 60. A gas substituted with the clean air within the processing space 60 flows to form the one-direction flow, and then, is exhausted via the flow path 653b and discharged toward the downstream of the gas exhaust room 641 through the gas exhaust holes 642.

Here, in the wafer processing apparatus 140a of the second exemplary embodiment, the gap between the upper end of the surrounding member 52a and the ceiling surface of the processing space 61 is set to have a size that allows the air sent by the air pump 626 to flow toward the gas exhaust room 641 through the gas exhaust holes 642 and that allows a one-direction air flow within the processing space 60.

The constitution that the wafer W is heated by a heater 512 in this state, the SOC film F is formed on the surface of the wafer W coated with the source material L and by-products generated at that moment is exhausted through the gas exhaust holes 642 from the inside of the processing space 60 are the same as those of the wafer processing apparatus 140 according to the first exemplary embodiment as described above with reference to FIG. 10.

Also, as in the wafer processing apparatus 140 according to the first exemplary embodiment, the supply of the clean air through the gas introduction holes 622 and the exhaust of the inside of the processing space 60 through the gas exhaust holes 642 are stopped at the timing when the SOC film F is formed; ozone or active oxygen are generated within the processing space 60 by turning on the UV lamps 72; a part of the SOC film F is removed (see FIG. 11); the inside of the processing space 60 is exhausted by forming the one-direction flow of the gas flowing from the gas introduction holes 622 toward the gas exhaust holes 642 after removing the part of the SOC film F.

In the wafer processing apparatus 140a according to the second exemplary embodiment illustrated in FIG. 14 to FIG. 16, the gas introduction room 621 for supplying the clean air into the processing space 60 is located below the processing space 60, and the gas exhaust room 641 through which the gas exhausted from the processing space 60 is discharged is also provided below the processing space 60. Accordingly, an air supply device (the flange 640 in a region where the gas introduction room 621 is provided, the air supply line 624, and so forth) for the supply of the clean air and a gas exhaust device (the flange 640 in a region where the gas exhaust room 641 is formed, the gas exhaust line 644, and so forth) for the exhaust of the gas within the processing space 60 can be provided by using a space within the housing 300a constituting the wafer processing apparatus 140a. Thus, the wafer processing apparatus 140a can be reduced in size as compared to the wafer processing apparatus 140 of the first exemplary embodiment where the gas introduction room 621, the gas exhaust room 641 and the processing space 60 are arranged horizontally.

In addition, the scale-down of the wafer processing apparatus 140a of the second exemplary embodiment can also be achieved by the following configurations. That is, the transfer arm 41 serving as a cooling arm may not be provided, and the wafer W may be directly delivered between the supporting pins 541 and the wafer transfer device 122 that has entered through the carry-in/out opening 301. Further, the supporting pins 541 are supported at a certain height position by a base 543 and are configured not to be moved up and down. Besides, a height dimension of the housing 300a is also decreased.

Now, referring to FIG. 17 and FIG. 18A to FIG. 18E, a wafer processing apparatus 140b according to a third exemplary embodiment will be described.

As stated above, in the wafer processing apparatus 140a according to the second exemplary embodiment, the oxygen supply space 602, which is provided in the wafer processing apparatus 140 of the first exemplary embodiment, is not provided in order to scale down the apparatus and so forth. In such a case, however, when the UV rays are irradiated to the oxygen-containing atmosphere within the narrow processing space 60 without supplying the clean air, the concentration of the active oxygen or ozone would be reduced as the SOC film is moved, so that the removing rate of the SOC film may be decreased.

Figure 17:
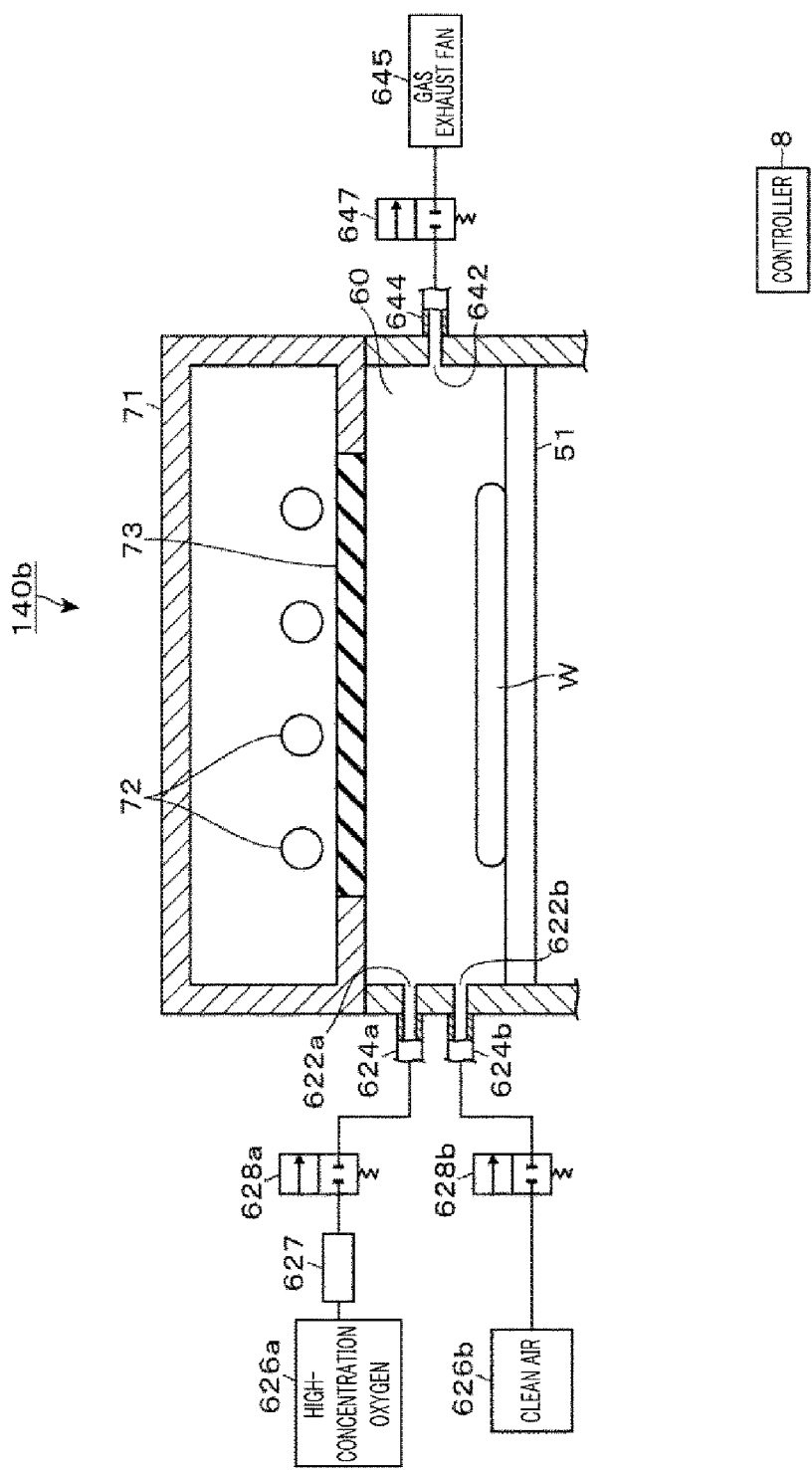
FIG. 17 is a schematic diagram enlarging a part of a wafer processing apparatus according to a third exemplary embodiment.

To solve the problem, in the wafer processing apparatus 140b according to the third exemplary embodiment, a high-concentration oxygen supply device 626a configured to supply "high-concentration oxygen" into the processing space 60 is connected to the processing space 60, as depicted in FIG. 17. By increasing the amount of oxygen included in the oxygen-containing atmosphere, a requirement amount of the active oxygen or ozone for the removal of the SOC film can be obtained.

Further, in the wafer processing apparatus 140b shown in FIG. 17 and FIG. 18A to FIG. 18E, no surrounding member 52 or 52a is provided on the placing table 51.

In the preset exemplary embodiment, the term "high-concentration oxygen" refers to an oxygen-containing gas having an oxygen concentration higher than 21 vol % (in a normal state of 0° C. and 1 atmosphere) and equal to or lower than 60 vol %, more desirably, in the range from 25 vol % to 60 vol %. By way of example, the high-concentration oxygen may be prepared by mixing an oxygen gas into the clean air.

The high-concentration oxygen supply device 626a is connected to the processing space 60 of the wafer processing apparatus 140b shown in FIG. 17, and the high-concentration oxygen is supplied into the processing space 60 from a gas introduction hole 622a. The supply of the high-concentration oxygen into the processing space 60 is stopped by a pneumatic value 628a. Here, when preparing the high-concentration oxygen by mixing oxygen obtained by vaporizing liquid oxygen with clean air, for example, a temperature of the high-concentration oxygen may be decreased due to heat of vaporization at the time of vaporizing the liquid oxygen. Thus, in order to suppress the temperature of the processing space 60 from being decreased, a heating device 627 configured to heat the high-concentration oxygen is provided on an air supply line 624a.

Further, in the wafer processing apparatus 140b, a clean air supply device 626b configured to supply the clean air into the processing space 60 as an example exhausting gas for exhausting a gas within the processing space 60 is connected to the wafer processing apparatus 140b. The clean air is supplied into the processing space 60 from the clean air supply device 626b through an air supply line 624b connected to a gas introduction hole 622b, and the supply of the clean air into the processing space 60 is stopped by a pneumatic valve 628b. Further, the clean air supplied from the clean air supply device 626b is also used for forming the SOC film F as described above with reference to FIG. 10, FIG. 14, and so on. The clean air supply device 626b that supplies the clean air as the exhausting gas corresponds to an exhausting gas supply device of the present exemplary embodiment.

In addition, as depicted in FIG. 17, a start and a stop of the exhaust of the gas within the processing space 60 through a gas exhaust line 644 from a gas exhaust hole 642 are performed by a pneumatic valve 647. Operations of the aforementioned pneumatic valves 628a, 628b and 647 are controlled by supplying or stopping the supply of air for operation into the pneumatic valves 628a, 628b and 647 individually in response to control signals outputted from the controller 8.

Now, operations of the wafer processing apparatus 140b according to the third exemplary embodiment will be explained with reference to FIG. 18A to FIG. 18E.

Figure 18A:
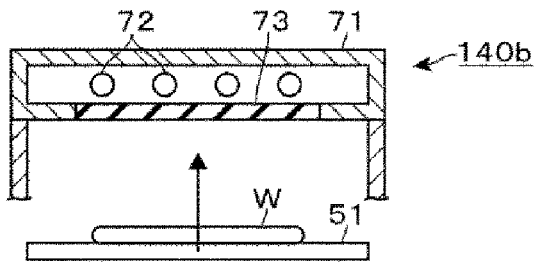
FIG. 18A to FIG. 18E are explanatory diagrams illustrating an operation of the wafer processing apparatus according to the third exemplary embodiment.

If a wafer W to be processed is placed on the placing table 51, the placing table 51 is moved upwards, and the processing space 60 is formed (FIG. 18A). Then, clean air is supplied into the processing space 60 from the clean air supply device 626b, and, in the meantime, a gas exhaust from the gas exhaust hole 642 is performed, so that a one-direction flow of the clean air is formed within the processing space 60. Since a subsequent process of forming a SOC film F on the wafer W by heating the wafer W is the same as that of the wafer processing apparatuses 140 and 140a according to the first and second exemplary embodiments, redundant description thereof will be omitted here.

Figure 18B:
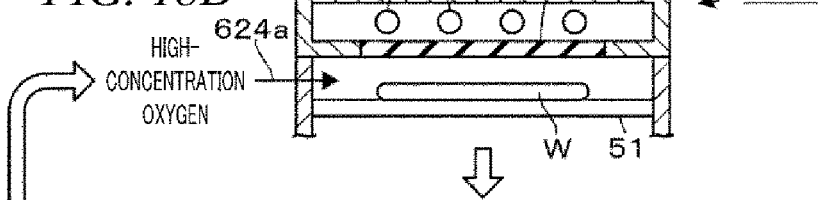

Upon the formation of the SOC film F, the gas supplied into the processing space 60 is substituted with the high-concentration oxygen from the clean air, so that an atmosphere containing the high-concentration oxygen is generated within the processing space 60 (FIG. 18B). At this time, the exhaust of the inside of the processing space 60 through the gas exhaust hole 642 may continue to accelerate the substitution of the gas within the processing space 60.

Subsequently, the supply of the high-concentration oxygen and the exhaust of the inside of the processing space 60 are stopped at a timing when the inside of the processing space 60 has turned into the oxygen-containing atmosphere of a predetermined oxygen concentration. Then, ozone or active oxygen are generated within the processing space 60 by turning on the UV lamps 72, and a process of removing a part of the SOC film F is performed (FIG. 18C).

Figure 18C:
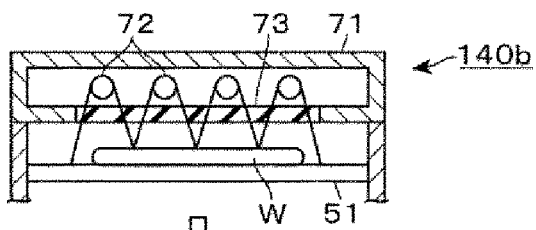
Figure 18D:
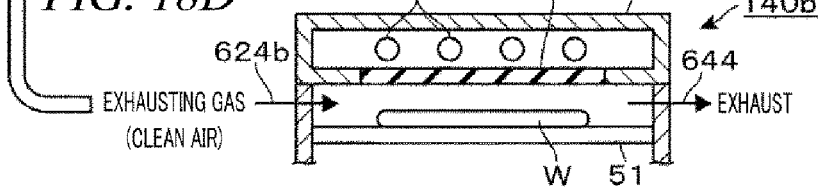

At a timing when a concentration of the ozone or active oxygen within the processing space 60 becomes lower than a previously set target concentration as they are consumed, the UV lamps 72 are turned off, and the exhaust of the inside of the processing space 60 is performed while supplying the clean air as the exhausting gas into the processing space 60 (FIG. 18D). Upon the completion of the exhaust of the processing space 60, the supplied gas is changed into the high-concentration oxygen, and the oxygen-containing atmosphere is generated again in the processing space 60.

Figure 18E:
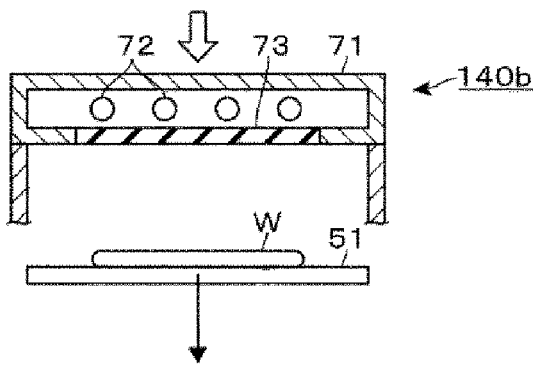

The above-described operations set forth in FIG. 18B to FIG. 18D are repeated plural times, for example, more than twice. If these operations are repeated the preset number of times, the placing table 51 is then lowered, and the wafer W is carried out of the wafer processing apparatus 140b (FIG. 18E).

In the wafer processing apparatus 140b according to the third exemplary embodiment, the oxygen-containing atmosphere can be generated by supplying the high-concentration oxygen, and the gas within the processing space 60 can be substituted to generate a new oxygen-containing atmosphere at the timing when the ozone or active oxygen are consumed. Accordingly, a decrease of the removing rate of the SOC film F can be suppressed, and it is possible to remove a desired amount of SOC film F in a comparatively short time period.

Further, the removal of the SOC film F by using the high-concentration oxygen can also be performed in the wafer processing apparatus 140 equipped with the surrounding member 52 and the oxygen supply space 602 according to the first exemplary embodiment. In addition, in case of removing a part of the SOC film simply by using the clean air without supplying the high-concentration oxygen as well, a gas within the processing space 60 may be substituted by repeatedly performing the operations of FIG. 18B to FIG. 18D.

In the wafer processing apparatuses 140, 140a and 140b according to the above-described exemplary embodiments, it is not essentially necessary to provide the surrounding member 52 within the processing chamber 61 (refer to the wafer processing apparatus 140b according to the third exemplary embodiment). For example, the wafer W may be placed on the placing table 51 not provided with the surrounding member 52, and after forming the processing space 60, the UV rays may be irradiated in the state where the supply of the clean air into the processing space 60 and the exhaust of the inside of the processing space 60 are stopped. By irradiating the UV rays under the condition that the concentration of the active oxygen or ozone is not imbalanced as described with reference to FIG. 9, the SOC film can be more uniformly removed over the surface of the wafer W.

Further, in the wafer processing apparatuses 140, 140a and 140b shown in FIG. 5 and so forth, the heating process for the wafer W in order to form the SOC film and the UV-ray irradiation process for removing a part of the SOC film are performed in the common processing space 60 by using the same placing table 51. However, these processes may be performed on individual placing tables 51 (heating devices) or processing spaces 60.

The configuration of the processing chamber 61 is not limited to the aforementioned example where the opening 63 is formed at the bottom surface of the processing chamber 61 and the placing table 51 blocks the opening 63 to form the processing chamber 61. For example, the wafer W may be carried in and out through the side surface of the flat processing chamber.

Further, it is not essentially necessary, either, to vary a heating temperature in a diametrical direction of the wafer W by dividing the placing table 51 into the first placing table region 51a and the second placing table region 51b, or to vary an illuminance of the UV rays in the diametrical direction of the wafer W by dividing the UV transmission member 73 into the first UV transmission member 731 and the second UV transmission member 732.

Further, the temperature control of the wafer W with the transfer arm 41 may be performed in other temperature control apparatuses 143, 144, 153 and 154, or may not be performed by lowering the heating temperature for the wafer W during the UV-ray irradiation. As will be depicted in an example to be described later, if the heating temperature for the wafer W is set to be low, the removing rate of the SOC film may be decreased. However, if there is no limit in the processing time, the UV-ray may be irradiated at a room temperature.

Further, in the process of removing a part of the SOC film for the purpose of planarizing the surface of the wafer W, there has been described a method of removing the SOC film uniformly over the surface of the wafer W by irradiating the UV rays in the state that the gas flow velocity is equal to or less than 10 cm/sec or the exhaust of the inside of the processing space 60 is stopped. This method of removing a part of a film from the surface of the wafer W may not limited to the partial removal of the SOC film. By way of example, this method may also be applicable to a partial removal of another coating film.

EXPERIMENTAL EXAMPLES

Experiment 1

Within the sealed processing chamber 61 (processing space 60), a change in a removing rate of a SOC film with a lapse of time is observed by varying a temperature of the placing table 51 on which a wafer W is heated.

A. Conditions for the Experiment (Experimental example 1-1) A wafer W having thereon an organic film is placed on the placing table 51 in which a temperature of the entire surface thereof is set to 300° C. While irradiating the UV rays having a wavelength of 172 nm with an illuminance of 40 mW/cm$^2$, a processing time is varied to 5 minutes, 10 minutes, 20 minutes, 30 minutes and 60 minutes. A gap between a top surface of the wafer W and a bottom surface of the UV transmission member 73 is 3 mm.

(Experimental example 1-2) Except that a set temperature of the placing table 51 is 250° C., the wafer W is processed under the same conditions as those in experimental example 1-1.

(Experimental example 1-3) Except that a set temperature of the placing table 51 is 200° C., the wafer W is processed under the same conditions as those in experimental example 1-1.

B. Experimental Results

Figure 19:
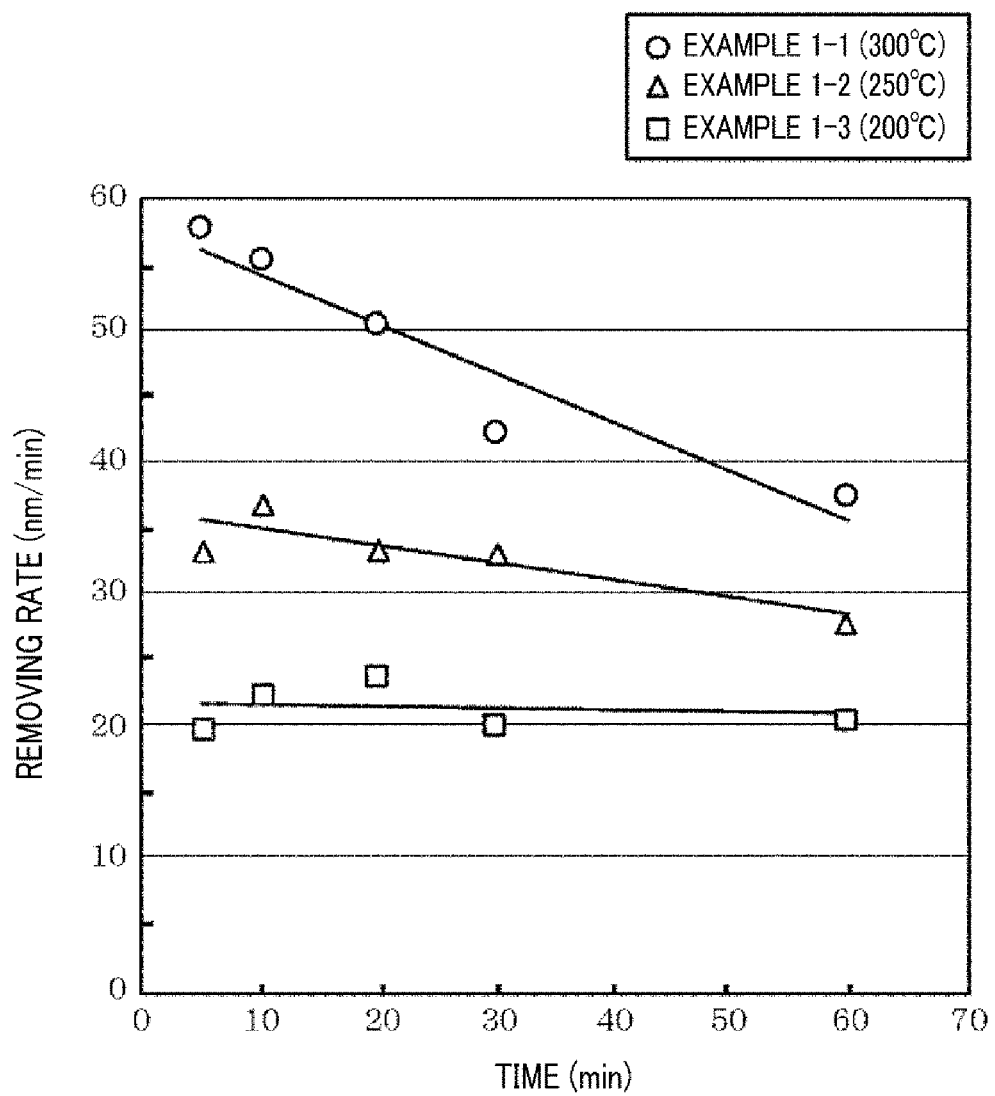
FIG. 19 is an explanatory diagram showing a relationship between a temperature of the placing table and a change in an organic film removing rate with a lapse of time.

Results of the experimental examples 1-1 to 1-3 are shown in FIG. 19. A horizontal axis on FIG. 19 represents the processing time (min) and a vertical axis denotes the removing rate (nm/min) of the organic film. A result of the experimental example 1-1 is indicated by ○; a result of the experimental example 1-2, Δ; and a result of the experimental example 1-3, □.

As can be seen from the results shown in FIG. 19, as the temperature of the placing table 51 increases, the removing rate of the organic film also increases. Meanwhile, in the experimental example 1-1 in which the temperature of the placing table 51 is set to 300° C., the removing rate of the organic film (an average value within each processing time) is found to decrease as the processing time increases. In the experimental example 1-2 in which the temperature of the placing table 51 is set to 250° C., there is also found the same tendency in the experimental example 1-1 that the removing rate of the organic film decrease as the processing time increases. In the experimental example 1-2, however, the decrease rate of the removing rate is slow than that in the experimental example 1-1. Further, in the experimental example 1-3 where the temperature of the placing table 51 is set to 200° C., the decrease of the removing rate of the organic film is not observed.

As described above, for the reason why the decrease of the removing rate takes place with the lapse of the processing time when the temperature of the placing table 51 is set to a high temperature, it is considered that with the rise of the temperature of the wafer W when the UV rays are irradiated thereto, decomposition of the organic film proceeds faster and the oxygen within the processing space 60 is consumed faster. Further, it is also considered that with the progress of the decomposition of the organic film, by-products are accumulated within the processing space 60, so that the reaction of generating the active oxygen or ozone from the oxygen by the UV-ray irradiation is suppressed, or an influence of a reaction between the active oxygen generated from the oxygen and the by-products becomes conspicuous.

In this aspect, as explained with reference to FIG. 11, the configuration where the outside of the surrounding member 52 is used as the oxygen supplement space may have an effect of suppressing the decrease of the removing rate of the organic film. Further, even if the removing rate of the organic film is reduced, there would be no problem in processing the wafer W as long as a certain amount of the organic film can be removed within a previously set time period.

Experiment 2

Within the sealed processing chamber 61 (processing space 60), a removing rate distribution over an entire surface of an organic film is measured when the wafer W is processed while varying the illuminance of the UV rays or the temperature of the placing table 51.

A. Conditions for the Experiment (Experimental example 2-1) The wafer W is processed for one minute under the same conditions as those of the experimental example 1-3 (the temperature of the placing table 51 is 200° C., and the illuminance of the UV rays is 40 mW/cm$^2$).

(Experimental example 2-2) Except that the illuminance of the UV rays is set to 60 mW/cm$^2$, the wafer W is processed under the same conditions as those of the experimental example 2-1.

(Experimental example 2-3) Except that the temperature of the placing table 51 is set to 300° C. and the illuminance of the UV rays is set to 60 mW/cm$^2$, the wafer W is processed under the same conditions as those of the experimental example 2-1.

B. Experimental Results

Figure 20:
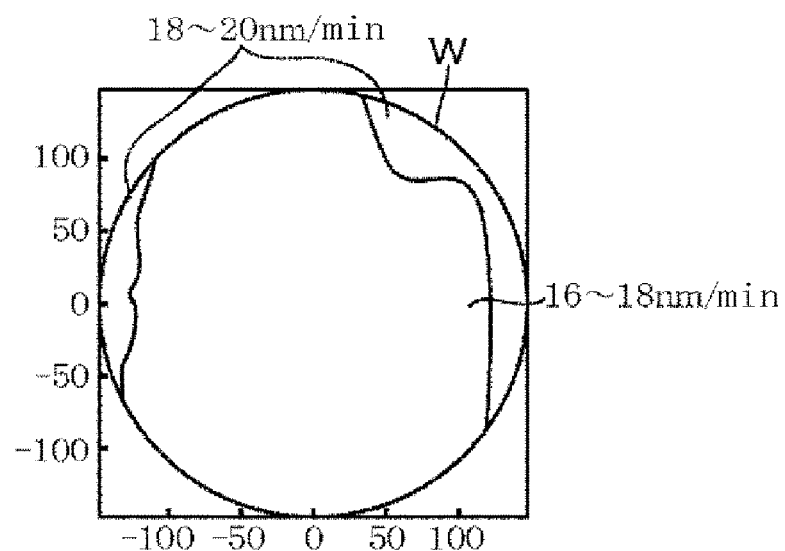
FIG. 20 is a first explanatory diagram showing a distribution of an organic film removing rate with the UV irradiation.
Figure 21:
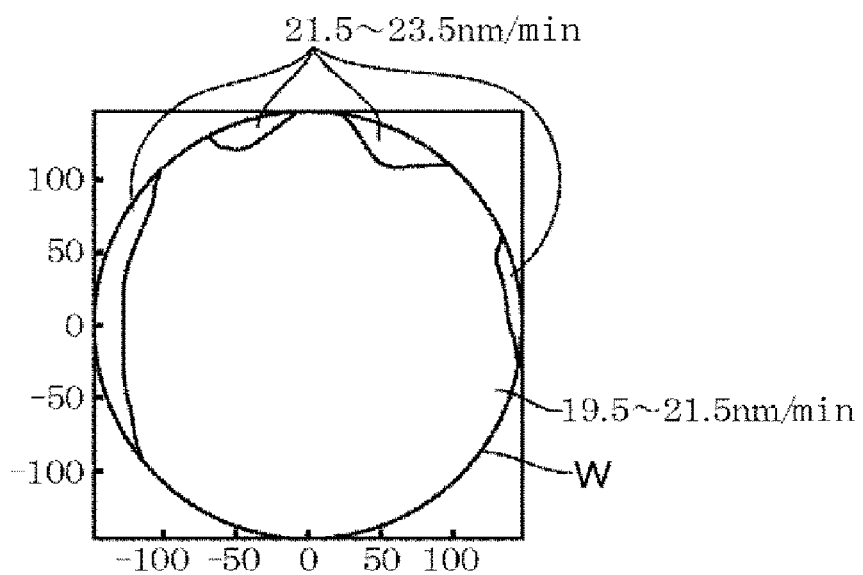
FIG. 21 is a second explanatory diagram showing a distribution of an organic film removing rate with the UV irradiation.
Figure 22:
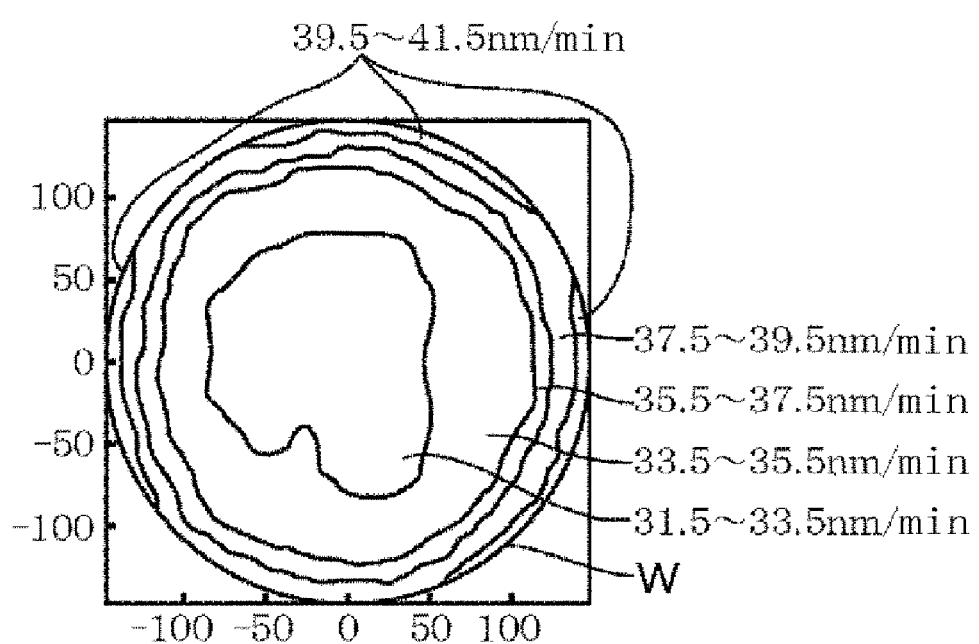
FIG. 22 is a third explanatory diagram showing a distribution of an organic film removing rate with the UV irradiation.

Results of the experimental examples 2-1 to 2-3 are shown in FIG. 20 to FIG. 22. In each figure, a circle indicates an outline of the wafer W, and a horizontal axis and a vertical axis are axes of coordinates that represent a distance from a center of the wafer W.

An average value of the removing rate over the entire surface of the organic film is found to be 16.9 nm/min in the experimental example 2-1, 20.5 nm/min in the experimental example 2-2, and 36.6 nm in the experimental example 2-3. As can be seen from this result, with the increase of the illuminance of the UV rays and, also, with the rise of the temperature of the placing table 51, the removing rate of the organic film also increases.

Meanwhile, in comparison of FIG. 20 to FIG. 22, in the experimental example 2-3 where the temperature of the placing table 51 is 300° C., the removing rate of the organic film is observed to increase from a central portion of the wafer W toward a peripheral portion thereof, whereas the uniformity of the removing rate over the entire surface thereof is deteriorated, as compared to the experimental examples 2-1 and 2-2 where the temperature of the placing table 51 is 200° C. This may be caused, as explained before with reference to FIG. 11, by a distribution of the by-products that are generated by the irradiation of the UV rays. In this aspect, a method of decreasing a temperature of the peripheral portion of the wafer W by generating a temperature difference between the first placing table region 51a and the second placing table region 51b, or a method of decreasing the illuminance of the UV rays irradiated to the peripheral portion of the wafer W by generating a difference in the UV-ray transmittance between the first UV transmission member 731 and the second UV transmission member 732 is considered as an effective way to process the surface of the wafer W uniformly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:
1. A substrate processing method, comprising:
coating a source material of a processing target film, which is decomposed by irradiating an ultraviolet ray thereto under an oxygen-containing atmosphere, on a substrate;
forming the processing target film by heating the source material coated on the substrate; and
removing a part of the processing target film by placing the substrate having thereon the processing target film within a processing chamber under the oxygen-containing atmosphere where a gas flow velocity is equal to or smaller than 10 cm/sec, and, then, by irradiating the ultraviolet ray to the substrate.

2. A substrate processing method, comprising:
coating a source material of a processing target film, which is decomposed by irradiating an ultraviolet ray thereto under an oxygen-containing atmosphere, on a substrate;
forming the processing target film by heating the source material coated on the substrate;
removing a part of the processing target film by placing the substrate having thereon the processing target film within a processing chamber provided with a gas exhaust device under the oxygen-containing atmosphere, and, then, by irradiating the ultraviolet ray to the substrate in a state where an exhaust of an inside of the processing chamber by the gas exhaust device is stopped; and
exhausting the inside of the processing chamber by the gas exhaust device.

3. The substrate processing method of claim 1, further comprising:
generating the oxygen-containing atmosphere by supplying an oxygen-containing gas, having an oxygen concentration higher than that in the air and equal to or lower than 60 vol %, into the processing chamber before the removing of the part of the processing target film.

4. The substrate processing method of claim 2, further comprising:
generating the oxygen-containing atmosphere by supplying an oxygen-containing gas, having an oxygen concentration higher than that in the air and equal to or lower than 60 vol %, into the processing chamber before the removing of the part of the processing target film,
wherein the generating of the oxygen-containing atmosphere, the removing of the part of the processing target film and the exhausting of the inside of the processing chamber are repeatedly performed.

5. The substrate processing method of claim 2, further comprising:
supplying an exhausting gas for facilitating the exhaust of the inside of the processing chamber when performing the exhausting of the inside of the processing chamber by the gas exhaust device,
wherein the supplying of the exhausting gas is performed when performing the exhausting of the inside of the processing chamber.

6. The substrate processing method of claim 1, further comprising:
heating the substrate while performing the removing of the part of the processing target film.

7. The substrate processing method of claim 6,
wherein the heating of the substrate is performed such that a temperature of a peripheral portion of the substrate becomes lower than a temperature of a central portion of the substrate.

8. The substrate processing method of claim 1,
wherein the removing of the part of the processing target film is performed under a condition where an illuminance of the ultraviolet ray is respectively set for regions of the substrate.

9. The substrate processing method of claim 1, further comprising:
placing the substrate coated with at least the source material of the processing target film on a placing table at a transfer position, and then, moving the placing table up to a processing position; and
lowering the placing table, on which the substrate from which the part of the processing target film is removed is placed, from the processing position to the transfer position, and then, carrying out the substrate,
wherein an opening is formed at a bottom surface of the processing chamber, and the placing table is configured to be fitted into the opening and hold the substrate placed thereon, and an elevating device is configured to move the placing table up and down between the transfer position where the substrate is transferred and the processing position which is above the transfer position and where the opening of the processing chamber is blocked and the substrate is placed within the processing chamber.

10. The substrate processing method of claim 1,
wherein the processing target film is an organic film containing a carbon compound.

11. The substrate processing method of claim 1,
wherein the coating of the source material of the processing target film is performed on the substrate having thereon a pattern,
the coating of the source material of the processing target film on the substrate, the forming of the processing target film and the removing of the part of the processing target film are performed multiple times in this sequence, and
in the removing of the part of the processing target film performed at least before the last time, the part of the processing target film is removed until a surface of the pattern is exposed.

12. A computer-readable recording medium having stored thereon computer-executable instructions that, in response to execution, cause a substrate processing system to perform a substrate processing method as claimed in claim 1,
wherein the substrate processing system performs a removing process of removing a part of a processing target film by irradiating an ultraviolet ray to a substrate having thereon the processing target film under an oxygen-containing atmosphere.

* * * * *